(12) United States Patent
Masafumi

(10) Patent No.: US 7,728,297 B2
(45) Date of Patent: Jun. 1, 2010

(54) INFRARED ARRAY SENSOR

(75) Inventor: Kimata Masafumi, Kusatsu (JP)

(73) Assignee: The Ritsumeikan Trust (JP)

( * ) Notice: Subject to any disclaimer, the term of this patent is extended or adjusted under 35 U.S.C. 154(b) by 0 days.

(21) Appl. No.: 12/275,407

(22) Filed: Nov. 21, 2008

(65) Prior Publication Data

US 2009/0101821 A1    Apr. 23, 2009

Related U.S. Application Data

(63) Continuation of application No. PCT/JP2007/059457, filed on May 7, 2007.

(30) Foreign Application Priority Data

May 24, 2006 (JP) ............................. 2006-143965

(51) Int. Cl.
G01J 5/00 (2006.01)
(52) U.S. Cl. .................................. 250/338.3
(58) Field of Classification Search ................ 250/332, 250/338.3, 338.4, 370.14
See application file for complete search history.

(56) References Cited

U.S. PATENT DOCUMENTS

| | | | |
|---|---|---|---|
| 6,392,232 B1* | 5/2002 | Gooch et al. | 250/332 |
| 6,583,416 B1* | 6/2003 | Villani | 250/332 |
| RE38,527 E * | 6/2004 | Tanaka | 250/370.08 |
| 2005/0017190 A1* | 1/2005 | Eversmann et al. | 250/370.14 |
| 2006/0289726 A1* | 12/2006 | Paulus et al. | 250/221 |

FOREIGN PATENT DOCUMENTS

| | | |
|---|---|---|
| EP | 1607715 | 12/2005 |
| JP | 2004286576 | 9/2004 |
| WO | 2004083774 | 10/2004 |

OTHER PUBLICATIONS

International Search Report and Written Opinion, Jul. 5, 2007.

* cited by examiner

Primary Examiner—David P. Porta
Assistant Examiner—Faye Boosalis
(74) Attorney, Agent, or Firm—Thomas, Kayden, Horstemeyer & Risley, LLP

(57) ABSTRACT

There is provided an infrared array sensor, which is capable of positional specification and flow tracking of an object to be detected without performing image processing, and whose cost is low. An infrared array sensor 100 where pixels 101, each having a thermal infrared detector 102 whose electric properties change in accordance with incidence of infrared rays, are arrayed in two-dimensional matrix form, the infrared array sensor 100 including: a row output take-out means 103 configured so as to take out an electric signal to the outside as an output, the electric signal being in accordance with electric properties as a sum of electric properties respectively shown by the thermal infrared detectors 102 on each row; and a column output take-out means 104 configured so as to take out an electric signal to the outside as an output, the electric signal being in accordance with electric properties as a sum of electric properties respectively shown by the thermal infrared detectors 102 on each column.

18 Claims, 12 Drawing Sheets

INFRARED ARRAY SENSOR

CROSS-REFERENCE TO RELATED APPLICATIONS

This application is a continuation that claims the benefit of and priority to PCT Application No. JP2007/59457, filed May 7, 2007, which claims priority to Japanese Patent Application No. 2006-143965, filed on May 24, 2006.

TECHNICAL FIELD

The present invention relates to an infrared array sensor, where thermal infrared detectors for detecting infrared rays radiated from an object to be detected (heater) are two-dimensionally arrayed in a plurality of pixels on a substrate.

BACKGROUND ART

As well known, there have been developed, as devices for detecting a visible light, a CMOS (Complementary Metal-Oxide Semiconductor) array sensor where photodiodes to convert a light into electric charges are arranged in array form in respective pixels, and the like, in addition to a PSD (position sensitive detector) capable of detecting a position of a spot-like light. Such a CMOS array sensor is also capable of realizing positional specification and tracking of a high luminance point without performing complex image processing by taking out an electric charge, generated in each pixel, as an electric signal.

On the other hand, in the field of the infrared array sensor for detecting infrared rays, especially the infrared array sensor with thermal infrared detectors two-dimensionally arrayed on a substrate, there has not been proposed a technique for realizing positional specification and tracking of an object to be detected as a heater without performing complex image processing. Further, two-dimensional information cannot be acquired by amonopixel infrared sensor.

As conventional infrared array sensors known are a sensor configured so as to have shift resistors for selecting a row and for selecting a column and perform electronic scanning by these shift resistors, thereby to read an electric signal to the outside in each pixel (e.g. see Patent Document 1), and some other sensors Patent Document 1: U.S. Pat. No. 3,484,354 (paragraph [0033], FIG. 3, etc.)

DISCLOSURE OF INVENTION

Figure 1:
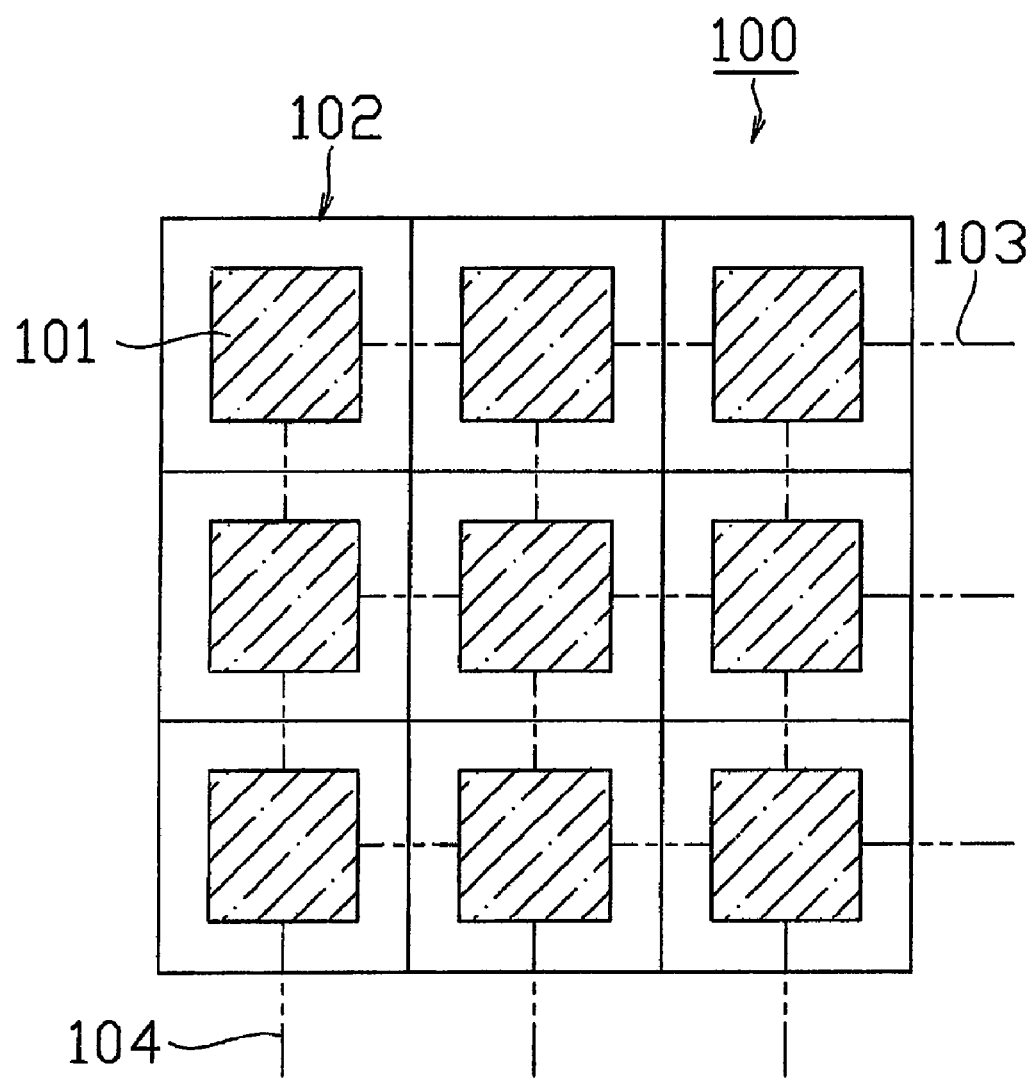
FIG. 1 is a conceptual view of an infrared array sensor 100 according to the present invention.

EXPLANATIONS OF REFERENTIAL NUMERALS 1, 11, 21, 31, 41, 61, 81, 100 Infrared array sensor
2 First temperature sensor
3 Second temperature sensor
4, 101 Thermal infrared detector
4A Leg section
4B Detector structure
5, 102 Pixel
6, 32 Row-direction series circuit
6a, 32a One end
6b, 32b The other end
7, 33 Column-direction series circuit
7a, 33a One end
7b, 33b The other end
8 Substrate
9 Temperature sensor
T Object to be detected
12 Row additional circuit
13 Column additional circuit
34 Switching means
35, 36, 37, 38 Switching transistor
42, 43 Power
44, 45 Amplifier
46, 47 MOS transistor
48, 49 Resistor
50a, 50b, 51a, 51b Terminal
62a, 62b, 63a, 63b Current-voltage conversion amplifier
64, 65 Differential amplifier
66, 67 Additional circuit
68, 69, 70, 71 Terminal
82, 83 MOS transistor
84, 85 Correction data supply circuit
86, 87 Amplifier
88, 89 Terminal
103 Row output take-out means
104 Column output take-out means
A First input/output terminal (of switching transistor)
B Second input/output terminal (of switching transistor)

DETAILED DESCRIPTION

However, in the infrared array sensor as described above, in order to perform positional specification and tracking of an object to be detected which radiates infrared rays, it is necessary to select a row and a column in a scanning circuit for reading an electric signal sequentially in every pixel in the infrared array sensor, and then perform advanced signal processing by use of an LSI (Large Scale Integration) for image processing, or the like. This necessitates preparation of electronic components of the scanning circuit, the LSI, and the like, and further necessitates development of an image processing program for detecting a thermal generation point from an acquired image. Although such a system is suitable for the military sphere and the like where acquiring high-resolution images is necessary, the system becomes complicated and large-scaled, resulting in high cost. Therefore, this system necessitates acquirement of two-dimensional information that cannot be acquired in a monopixel infrared sensor, thus causing the problem of not being suitable for a field where high performance is not much necessary but low cost is necessary.

The present invention was made in view of the circumstances and problems as described above, and has an object to provide an infrared array sensor which is capable of acquiring two-dimensional information without performing image processing, and whose cost is low.

MEANS FOR SOLVING THE PROBLEMS

In order to achieve the above object, an infrared array sensor according to claim 1 is an infrared array sensor, where pixels, each having a thermal infrared detector whose electric properties change in accordance with incidence of infrared rays, are arrayed in two-dimensional matrix form, the sensor including: a row output take-out means configured so as to take out an electric signal to the outside as an output, the electric signal being in accordance with electric properties as a sum of electric properties respectively shown by the thermal infrared detectors on each row; and a column output take-out means configured so as to take out an electric signal to the outside as an output, the electric signal being in accordance with electric properties as a sum of electric properties respectively shown by the thermal infrared detectors on each column.

An infrared array sensor according to claim 2 is an infrared array sensor where pixels, each having a thermal infrared detector that includes first and second temperature sensors whose electric properties change in accordance with a temperature change that occurs due to incidence of infrared rays, are arrayed in two-dimensional matrix form so as to simultaneously observe the whole field of view, the sensor including: a row-direction series circuit in which the first temperature sensors are electrically connected in series on each row so as to take out an electric signal to the outside as an output, the electric signal being in accordance with electric properties as a sum of electric properties respectively shown by the first temperature sensors; and a column-direction series circuit in which the second temperature sensors are electrically connected in series on each column so as to take out an electric signal to the outside as an output, the electric signal being in accordance with electric properties as a sum of electric properties respectively shown by the second temperature sensors, wherein the temperature sensor includes any of a thermopile-type temperature sensor, a resistance bolometer-type temperature sensor, and a diode-type temperature sensor.

An infrared array sensor according to claim 3 is an infrared array sensor, where pixels each having a thermal infrared detector that includes one temperature sensor whose electric properties change in accordance with a temperature change that occurs due to incidence of infrared rays, are arrayed in two-dimensional matrix form, the sensor including: a row-direction series circuit in which the temperature sensors are electrically connected in series on each row; a column-direction series circuit in which the temperature sensors are electrically connected in series on each column; and a switching means for switching a state where each of the row-direction series circuits is electrically connected and all electric connections of the temperature sensors among different columns are cut to and from a state where each of the column-direction series circuits is electrically connected and all electric connections of the temperature sensors among rows are cut.

An infrared array sensor according to claim 4 is the infrared array sensor according to claim 3, characterized in that switching transistors are electrically connected in series among the temperature sensors in the pixels that are adjacent respectively in the row-direction and the column-direction, and the switching means switches a state by turning ON/OFF the switching transistors by means of two control signals.

An infrared array sensor according to claim 5 is the infrared array sensor according to any one of claims 2 to 4, characterized in that electric properties of each of the temperature sensors equivalently change in accordance with a temperature change that occurs due to incidence of infrared rays.

An infrared array sensor according to claim 6 is the infrared array sensor according to any one of claims 2 to 5, characterized in that electric properties of the temperature sensor change in accordance with a temperature change in a detection region thermally independent in each of the pixels.

An infrared array sensor according to claim 7 is the infrared array sensor according to any one of claims 2 to 6, characterized in that the temperature sensor is provided on a detector structure supported on a substrate as a heat sink through a leg section.

An infrared array sensor according to claim 8 is the infrared array sensor according to any one of claims 2 to 7, characterized in that every one end of each of the row-direction series circuits and/or every one end of each of the column-direction series circuits are short-circuited, and the short-circuited one ends are connected to a power supply or a ground level.

An infrared array sensor according to claim 9 is the infrared array sensor according to any one of claims 2 to 8, characterized in that the sensor has, on at least either each row or each column, a constant current source that allows a current to flow, the current being set in accordance with an input signal that is a signal taken out of each of the row-direction series circuits or each of the column-direction series circuits, a first terminal of each of the constant current sources is each connected to a constant potential, a second terminal of each of the constant current sources which are adjacent is connected to each other through a resistor, and the second terminal of each of the constant current sources on both the outermost rows and both the outermost columns is connected to a voltage source through a resistor.

An infrared array sensor according to claim 10 is the infrared array sensor according to claim 9, characterized in that a resistance value of each resistor, connected between the second terminals of the constant current sources that are adjacent on at least each row or each column, is all equivalent.

An infrared array sensor according to claim 11 is the infrared array sensor according to claim 9 or 10, characterized in that conversion properties of a current, allowed to flow with respect to an input signal of each of the constant current sources on at least each row or each column, are all equivalent.

An infrared array sensor according to claim 12 is the infrared array sensor according to any one of claims 9 to 11, characterized in that power supply voltages of the voltage sources, connected to the second terminals of the constant current sources on both the outermost rows or both the outermost columns through the resistors, are equivalent.

An infrared array sensor according to claim 13 is the infrared array sensor according to any one of claims 9 to 12, characterized in that a current-voltage conversion amplifier having a voltage source for supplying a constant voltage is connected to the resistor that is connected to each of the constant current sources being on at least both the outermost rows or both the outermost columns, output terminals of each of the current-voltage conversion amplifiers are connected respectively to a differential amplifier and an additional amplifier, and outputs of the differential amplifier and the additional amplifier are regarded as outputs of the sensor.

An infrared array sensor according to claim 14 is the infrared array sensor according to any one of claims 9 to 13, characterized in that the sensor has, on at least either the row or the column, a second constant current source, a first terminal of which is connected to a node where a first constant current source capable of flowing a current is connected to a resistor column, the current being decided in accordance with a sum signal, the sum signal of the row or the column being as a control input signal, and the sensor has an input capable of controlling a current amount, a second terminal of the constant current source is connected to a fixed potential, and the sensor has a correction data supply circuit for supplying data for controlling the current amount of the constant current source.

An infrared array sensor according to claim 15 is the infrared array sensor according to any one of claims 2 to 8, including: a peak column detection circuit that detects a column with the maximum difference between an output taken out of each of the column-direction series circuits in a first state and an output taken out of each of the column-direction series circuits in a second state; and/or a peak column detection circuit that detects a column with the maximum difference between an output taken out of the column-direction series circuit in the first state and an output taken out of the column-direction series circuit in the second state.

An infrared array sensor according to claim 16 is the infrared array sensor according to any one of claims 2 to 8, including: a peak row position detecting circuit that fits a difference between an output taken out of each of the row-direction series circuits in a first state and an output taken out of each of the row-direction series circuits in a second state to a function, and detects a position of a row with a value of the difference-fitted function being the maximum; and/or a peak column position detecting circuit that fits a difference between an output taken out of each of the column-direction series circuits in the first state and an output taken out of each of the column-direction series circuits in the second state to a function, and detects a position of a column with a value of the difference-fitted function being the maximum.

An infrared array sensor according to claim 17 is the infrared array sensor according to any one of claims 2 to 8, including: a row additional circuit that adds a difference between an output taken out of each of the row-direction series circuits in a first state and an output taken out of each of the row-direction series circuits in a second state to every row; and/or a column additional circuit that adds a difference between an output taken out of each of the column-direction series circuits in the first state and an output taken out of each of the column-direction series circuits in the second state to every column.

An infrared array sensor according to claim 18 is the infrared array sensor according to any one of claims 2 to 17, characterized in that each of the temperature sensors includes any of a thermopile-type temperature sensor, a resistance bolometer-type temperature sensor, and a diode-type temperature sensor.

EFFECTS OF THE INVENTION

The infrared array sensor according to claim 1 includes a row output take-out means which is configured so as to take out an electric signal to the outside as an output, the electric signal being in accordance with electric properties as a sum of electric properties respectively shown by the thermal infrared detectors on each row, and the electric properties of the thermal infrared detector in each pixel change in accordance with incidence of infrared rays. Therefore, when a pixel is present where a change has occurred on incidence of infrared rays, a change occurs on an electric signal taken out of the row output take-out means on a row including the pixel, whereby it is possible to specify a row including the pixel where the change has occurred on incidence of infrared rays. Further, similarly, since the column output take-out means is included, it is possible to specify a column including the pixel where the change has occurred on incidence of infrared rays. Hence it is possible to detect whether or not a change has occurred on incidence of infrared rays. Further, in a case where the number of objects having caused occurrence of the change on incidence of infrared rays is one within the field of view and the size of the object when imaged on the sensor is on the order of one pixel or not larger than that, the pixel where the change has occurred on incidence of infrared rays can be specified, so that the position of the object can be uniquely specified. Moreover, in a case where the object having caused occurrence of the change in incidence of infrared rays has a size exceeding the order of one pixel when imaged on the sensor, it is possible to specify the extension or the number of objects, or as the case may be, the position of the object. It is therefore possible to provide an infrared array sensor capable of acquiring two-dimensional information at low cost without performing image processing.

The infrared array sensor according to claim 2 includes a row-direction series circuit in which the first temperature sensors are electrically connected in series on each row, and electric properties of a first temperature sensor on each pixel change in accordance with a temperature change that occurs due to incidence of infrared rays. Therefore, when a pixel is present where a temperature change has occurred, a change occurs on an electric signal taken out of a row-direction series circuit on a row including the pixel, whereby it is possible to specify a row including the pixel where the change has occurred on incidence of infrared rays. Further, similarly, since the column-direction series circuit is included, it is possible to specify a column including the pixel where the change has occurred on incidence of infrared rays. Hence it is possible to detect whether or not a change has occurred on incidence of infrared rays. Further, in a case where the number of heaters having caused occurrence of the change on incidence of infrared rays is one within the field of view and the size of the heater when imaged on the sensor is on the order of one pixel or not larger than that, the pixel where the change has occurred on incidence of infrared rays can be specified, so that the position of the heater can be uniquely specified. Moreover, in a case where the heater having caused occurrence of the change in incidence of infrared rays has a size exceeding the order of one pixel when imaged on the sensor, it is possible to specify the extension or the number of heaters, or as the case may be, the position of the heater. It is therefore possible to provide an infrared array sensor capable of acquiring two-dimensional information at low cost without performing image processing. Furthermore, each temperature sensor in the row-direction series circuit and the column-direction series circuit can be brought into a constantly electrically connected state, which eliminates the need for providing a switching means or the like capable of switching connection between temperature sensors for control of the sensors, whereby it is possible to simplify a control means. Additionally, since each temperature sensor includes any of a thermopile-type temperature sensor, a resistance bolometer-type temperature sensor, and a diode-type temperature sensor, which do not require cooling and can be operated at a constant temperature, it is possible to give a non-cooling type infrared array sensor, and also realize simplification, size reduction and low consumption power of the infrared array sensor.

The infrared array sensor according to claim 3 includes a row-direction series circuit in which the temperature sensors are electrically connected in series on each row, and electric properties of a temperature sensor in each pixel change in accordance with a temperature change that occurs due to incidence of infrared rays. Therefore, when a pixel is present where a temperature change has occurred, a change occurs on an electric signal taken out of a row-direction series circuit of a row including the pixel, whereby it is possible to specify a row including the pixel where the change has occurred on incidence of infrared rays. Further, similarly, since the column-direction series circuit is included, it is possible to specify a column including the pixel where the change has occurred on incidence of infrared rays. Hence it is possible to detect whether or not a change has occurred on incidence of infrared rays. Further, in a case where the number of heaters having caused occurrence of the change on incidence of infrared rays is one within the field of view and the size of the heater when imaged on the sensor is on the order of one pixel or not larger than that, the pixel where the change has occurred on incidence of infrared rays can be specified, so that the position of the heater can be uniquely specified. Moreover, in a case where the heater having caused occurrence of the change in incidence of infrared rays has a size exceeding the order of one pixel when imaged on the sensor, it is possible to specify the extension or the number of heaters, or as the case may be, the position of the heater. It is therefore possible to provide an infrared array sensor capable of acquiring two-dimensional information at low cost without performing image processing. Furthermore, with the switching means included, a configuration can be formed such that only one temperature sensor is provided in each pixel, whereby it is possible to simplify a control means, and also reduce thermal conductance so as to realize high sensitivity.

The infrared array sensor according to the infrared array sensor of claim 4, switching transistors are electrically connected in series among the temperature sensors in the pixels that are adjacent, and the switching means switches the connecting state by turning ON/OFF the switching transistors by means of two control signals. It is therefore possible to realize in a simplified manner a configuration that switches the connecting state.

According to the infrared array sensor of claim 5, electric properties of each of the temperature sensors equivalently change in accordance with a temperature change that occurs due to incidence of infrared rays. It is therefore possible to configure in a simplified manner a means for processing an electric signal taken out of the row-direction series circuit or the column-direction series circuit, and also to prevent reduction in detection accuracy due to variations of sensitivity of the temperature sensors. It is to be noted that when electric properties of respective temperature sensors change equivalently in accordance with a temperature change, it means that changes in electric properties corresponding to an arbitrary temperature change are equivalent, or the changes in electric properties have small variations to such an extent as to be considered as equivalent in view of detection accuracy of the temperature sensors.

According to the infrared array sensor of claim 6, electric properties of the temperature sensor change in accordance with a temperature change in a detection region thermally independent in each of the pixels. Namely, the temperature sensor detects a temperature change in a detection region thermally independent in each pixel. Therefore, the heat does not shift between the pixels in the respective detection regions thereof, thus allowing the temperature sensor to detect a temperature change unique to each pixel without being affected by a temperature change in an adjacent pixel. It is thereby possible to improve detection accuracy of the infrared array sensor. It is to be noted that "the detection region being thermally independent" means that high thermal resistance is present between the detection regions, thermal conduction between the detection regions is extremely small, and transfer of a temperature change between the detection regions can be ignored in the case of considering intervals of detection time of the infrared array sensor.

According to the infrared array sensor of claim 7, it is possible to realize in a simplified manner a configuration in which a temperature change in the thermally independent detection region can be detected by the temperature sensor in each pixel, so as to improve detection accuracy of the infrared array sensor.

According to the infrared array sensor of claim 8, it is possible to reduce wiring for taking out an output from each row-direction series circuit and each column-direction series circuit from the infrared array sensor.

According to the infrared array sensor of claim 9, for example in the case of the infrared array sensor having the configuration recited in claim 9 concerning the rows, the second terminal of each of the constant current sources on both the outermost rows is taken as an output terminal, so that the number of output terminals concerning the rows can be two. Based upon outputs from these output terminals, a sum of electric signals taken out of the maximum output row and all row-direction series circuits can be obtained. Therefore, configuring a simple current-type analog circuit can reduce the number of output terminals concerning the rows from the number of rows or twice as large into two. The same applies to the columns.

According to the infrared array sensor of claims 10 to 12, it is possible to configure in a simplified manner a means for obtaining the maximum output row or the like based upon an output from the output terminal, and also to prevent reduction in detection accuracy of the sensor. It is to be noted that "being equivalent" in claims 10 to 12 is not restricted to the case of being completely the same, but means that outputs from the output terminals have small variations to such an extent as to be considered as equivalent in view of detection accuracy of the temperature sensors.

According to the infrared array sensor of claim 13, since an output of the current-type analog circuit is converted into a voltage, and circuits for obtaining a difference and a sum are provided, it is possible to perform positional detection of the heater and area measurement of the heater directly from an output of the infrared array sensor.

According to the infrared array sensor of claim 14, since a correction function is added to the current-type analog signal processing circuit, it is possible to prevent deterioration in detection capacity of the infrared array sensor having variations of sensitivity which is caused by the variations of sensitivity, and also to realize the function of detecting a change from an arbitrary reference background without using a specific image memory.

According to the infrared array sensor of claim 15, since the peak row detecting circuit and the peak column detecting circuit are included, it is possible to specify a position of thermal generation point of a temperature peak in units of pixels, so as to facilitate tracking of the object to be detected.

According to the infrared array sensor of claim 16, since the peak row position detecting circuit and the peak column position detection circuit are included, it is possible to obtain a point of the maximum output, a position of the thermal generation point as a temperature peak, with accuracy of length smaller than a pitch between the pixels, so as to improve accuracy in positional specification of the thermal generation point.

According to the infrared array sensor of claim 17, since the row additional circuit and the column additional circuit are included, it is possible to facilitate specification of the area of the object to be detected to not larger than a prescribed degree.

According to the infrared array sensor of claim 18, since each of the temperature sensors includes any of a thermopile-type temperature sensor, a resistance bolometer-type temperature sensor, and a diode-type temperature sensor, it is possible to configure a non-cooling type infrared array sensor, and also realize simplification, size reduction and low power supply consumption of the infrared array sensor.

In the following, an infrared array sensor 100 according to the present invention is described based upon the drawings. As conceptually shown in FIG. 1, in the infrared array sensor 100, pixels 102 having thermal infrared detectors 101 are arrayed in two-dimensional matrix form, and the infrared array sensor 100 includes row output take-out means 103 and column output take-out means 104. It is to be noted that the number of rows and the number of columns of the pixels 102 are not restricted to 3-rows×3 columns as in FIG. 1, but the number of rows may be two or not smaller than four, or the number of columns may be two or not smaller than four. Further, the numbers of the rows and columns of the pixels 102 are not necessarily required to be the same. Moreover, the number of pixels on each row and column may be different. Furthermore, the rows and the columns are not necessarily orthogonal.

Electric properties of the thermal infrared sensor 101 changes in accordance with a thermal change that occurs due to incidence of infrared rays, and thereby the thermal infrared sensor 101 detects the infrared rays. The row output take-out means 103 is configured so as to take out, to the outside as an output, an electric signal in accordance with electric properties as a sum of electric properties respectively shown by the thermal infrared sensors 101 on each row. The column output take-out means 104 is configured so as to take out, to the outside as an output, an electric signal in accordance with electric properties as a sum of electric properties respectively shown by the thermal infrared sensors 101 on each column.

Figure 2:
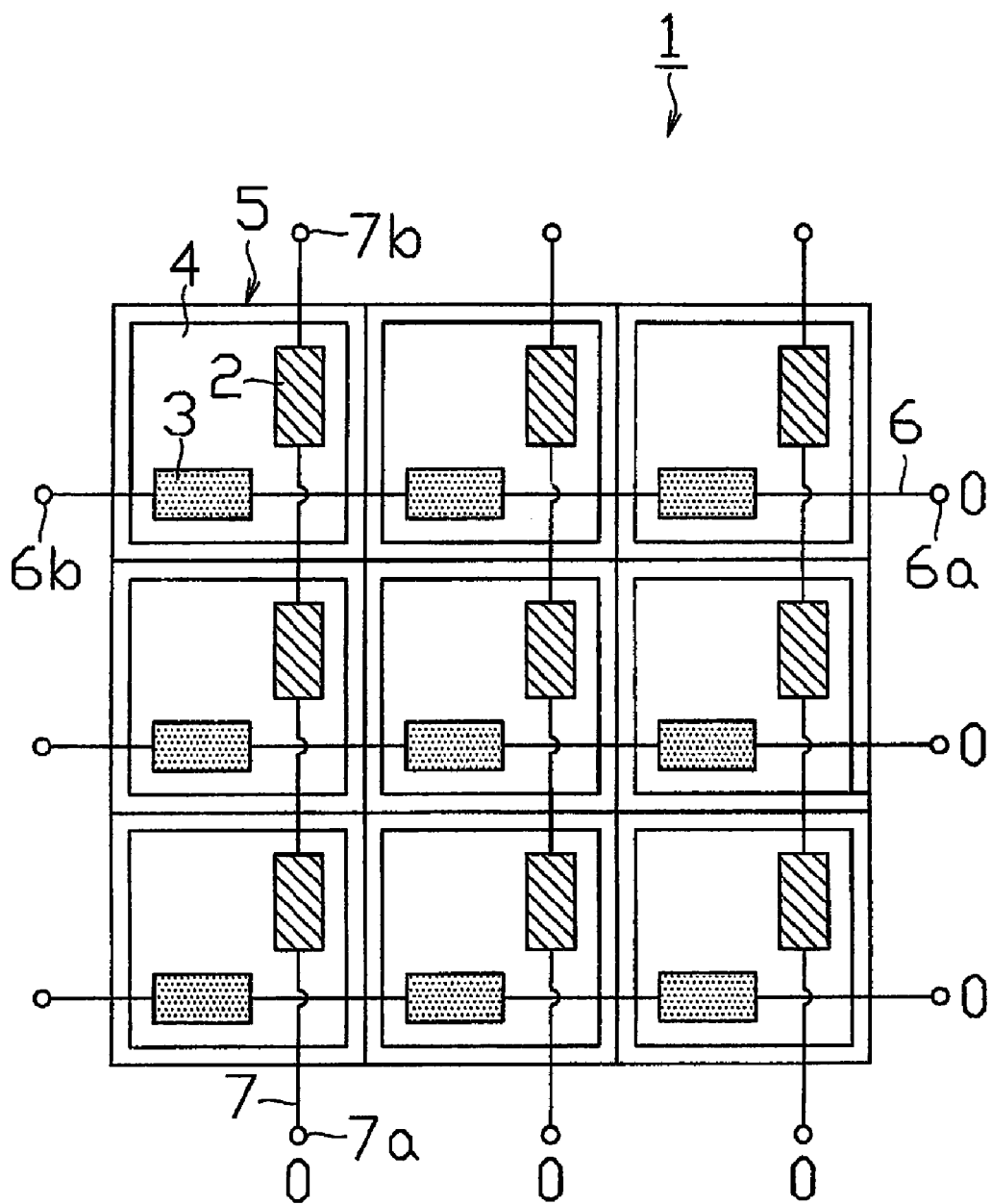
FIG. 2 is schematic circuit diagram of an infrared array sensor 1 according to a first embodiment.

In the following, the infrared array sensor 1 in accordance with a first embodiment of the present invention is described based upon the drawings. As shown in FIG. 2, in the infrared array sensor 1, pixels 5, each having a thermal infrared sensor 4 that includes first and second temperature sensors 2 and 3, are arrayed in two-dimensional matrix form, and the infrared array sensor 1 includes: row-direction series circuits 6 formed by electrically connecting the first temperature sensors 2 in series on respective rows; and the column-direction series circuits 7 formed by electrically connecting the second temperature sensor 3 in series on respective columns.

The first and second temperature sensors 2 and 3 are sensors whose electric properties change in accordance with a temperature change that occurs due to incidence of infrared rays. Examples of the type of the temperature sensors 2 and 3 may include a resistance bolometer-type, a thermopile type, and a diode type, but the sensors may be any kind of type so long as a sum of outputs of the first and second temperature sensors 2 and 3 can be obtained. A wavelength band of infrared rays that can be detected by the infrared array sensor 1 using such temperature sensors 2 and 3 is not particularly restricted, but is preferably a band of 3 to 5 micron meters or a band of 8 to 14 micron in which sufficiently radiation is performed in the vicinity of a room temperature and atmospheric transparency is high. Further, the first and second temperature sensors 2 and 3 may be the same type or different types.

The first temperature sensors 2 are electrically connected in series on each row, and for example, three first temperature sensors 2 connected in series form the row-direction series circuit 6 on each row. Each row-direction series circuit 6 is configured such that an electric signal in accordance with electric properties as a sum of electric properties shown respectively by the first temperature sensors 2 can be taken out to the outside from each of both ends (one end and the other end) 6a and 6b, and functions as the row output take-out means 103. An output from each of both ends 6a and 6b of the row-direction series circuit 6 is a sum of outputs of the first temperature sensors 2 included in each row-direction series circuit 6.

The second temperature sensor 3 are electrically connected in series on each column, and for example, three second temperature sensors 3 connected in series form the column-direction series circuit 7 on each column. Each column-direction series circuit 7 is configured such that an electric signal in accordance with electric properties as a sum of electric properties shown respectively by the temperature sensors 3 can be taken out to the outside from each of both ends (one end and the other end) 7a and 7b, and functions as the column output take-out means 103. An output from each of both ends 7a and 7b of the column-direction series circuit 7 is a sum of outputs of the second temperature sensors 3 included in each column-direction series circuit 7.

Figure 3:
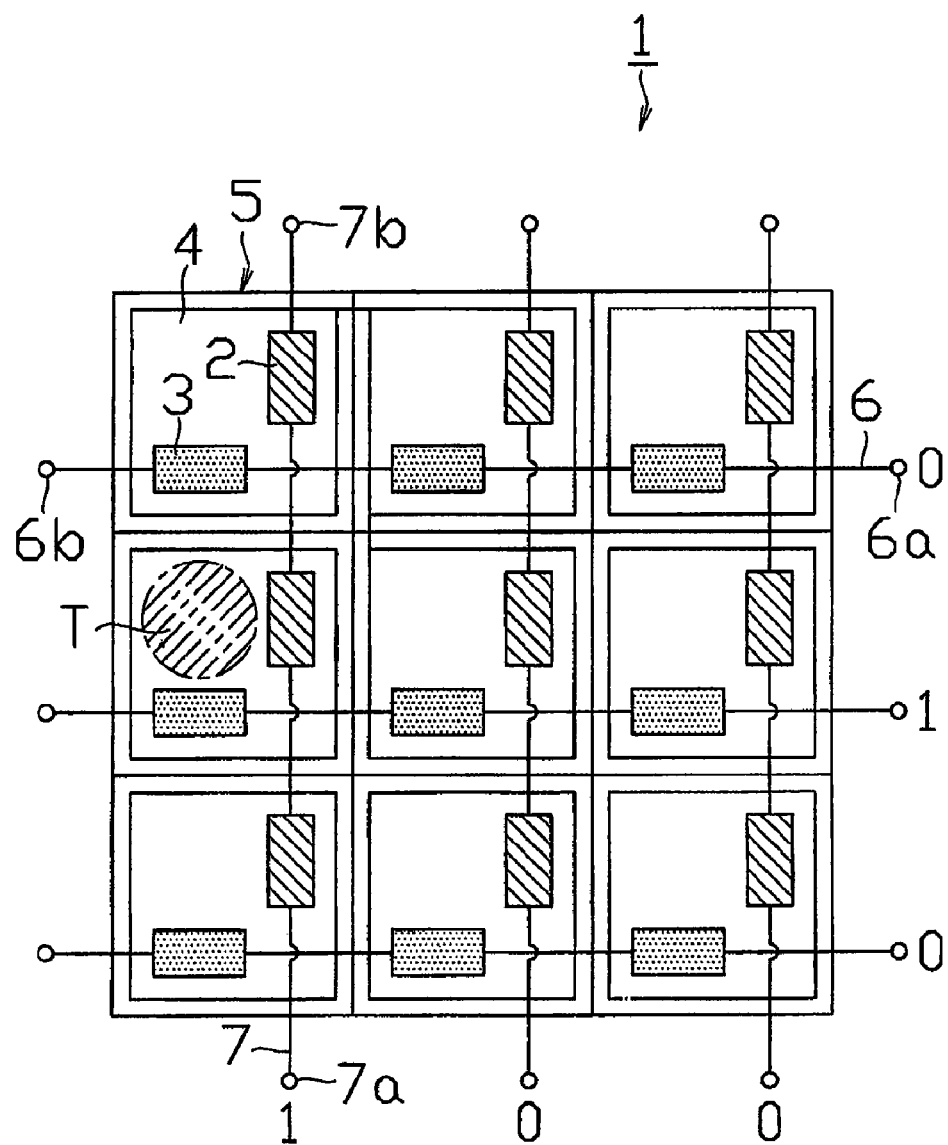
FIG. 3 is a schematic circuit diagram of an infrared array sensor 11 for explaining a state of detecting an object T to be detected.

Next, the operation of the infrared array sensor 1 is described based upon FIGS. 2 and 3. It is to be noted that "0" and "1" in these figures conceptually represent levels (signal levels) of outputs taken out of both ends 6a and 6b of each row-direction series circuit 6 and both ends 7a and 7b of each column-direction series circuit 7, and "0" represents a case where an object T to be detected (heater) is not present within a detection area (field of view) of any pixel 5 included in each row or each column, namely a case where an object to be detected is not present in an object region being photographed, and "1" represents a case where the object T to be detected is present within the detection area of any pixel 5 included in each row or each column, namely a case where the object to be detected is present in the object region being photographed. Here, even in a state where the object T to be detected is not present within the detection area of any pixel 5 included in each row or each column, it is not necessary that infrared rays be radiated uniformly to all pixels 5. Further, due to variations of properties of the first temperature sensors 2 and 3, the level of the output taken out of each row-direction series circuit 6 and each column-direction series circuit 7 may be different in a state where the object T to be detected is not present in any pixel 5 included in each row or each column. When these output levels remain unchanged with time, each of constant states thereof is taken as a reference, and measuring the difference between the reference and the output level can detect the object T to be detected. Therefore, an absolute value of the output in the case of being represented with "0" may be different on each row or each column.

For example, when a pixel 5 located on the second row and the first column detects the object T to be detected, namely, the first and second temperature sensors 2 and 3 present in the pixel 5 detects a temperature change, a level of an output taken out of each of both ends 6a and 6b of the row-direction series circuit 6 on the second row and a level of an output taken out of each of both ends 7a and 7b of the column-direction series circuit 7 on the first column change. In this case, the position of the pixel 5 where the pixel 5 has been detected is specified to be on the second row and the first column in which the output level has changed.

For example, in the case of the temperature sensors 2 and 3 being thermopile-type temperature sensors, the temperature sensors 2 and 3 in each pixel 5 generate electromotive force corresponding to energy of infrared rays received in the pixel 5. The level of the output taken out of each row-direction series circuit 6 is one obtained by addition of electromotive force generated by each first temperature sensor 2 included in each row. The level of the output taken out of each column-direction series circuit 7 is one obtained by addition of electromotive force generated by each second temperature sensor 3 included in each column. The added values of electromotive force on each row can be obtained by measuring a voltage of both ends 6a and 6b of each row-direction series circuit 6. The added value of electromotive force on each column can be obtained by measuring a voltage of both ends 7a and 7b of each column-direction series circuit 7.

In the case of the temperature sensors 2 and 3 being resistance bolometer-type temperature sensors, the temperature sensors 2 and 3 in each pixel 5 show electric resistance values corresponding to energy of infrared rays received in the pixel 5. An electric resistance value of each row-direction series circuit 6 is one obtained by adding electric resistance values shown by the respective first temperature sensors 2 included in each row. The electric resistance value of each column-direction series circuit 7 is one obtained by adding electric resistance values shown by the second temperature sensors 3 included in each column. The electric resistance value of each row-direction series circuit 6 and the electric resistance value of each column-direction series circuit 7 can be obtained respectively such that, in a state where power supplies are connected to one ends 6a and 7a of the series circuits 6 and 7 and the other ends 6b and 7b of the series circuits 6 and 7 are grounded through load resistors or constant current sources, voltages of the other ends 6b and 7b of the series circuits 6 and 7 are measured.

In the case of the temperature sensors 2 and 3 being diode-type temperature sensors using diodes biased at a constant current in a forward direction, the temperature sensors 2 and 3 in each pixel 5 show forward voltages (voltage-fall at both ends of diodes) corresponding to energy of infrared rays received in the pixel 5. A total forward voltage of a forward voltage of each row-direction series circuit 6 (voltage-fall at both ends of all diodes connected in series) is obtained by adding forward voltages (voltage-fall at both ends of diodes) of the respective first temperature sensors 2 included in each row. A total forward voltage of a forward voltage of each column-direction series circuit 7 (voltage-fall at both ends of all diodes connected in series) is obtained by adding forward voltages (voltage-fall at both ends of diodes) of the respective second temperature sensors 3 included in each column. A total forward voltage of each row-direction series circuit 6 and a total forward voltage of each column-direction series circuit 7 can be obtained respectively such that, in a state where the power supplies are connected to one ends 6a and 7a of the series circuits 6 and 7 and the other ends 6b and 7b of the series circuits 6 and 7 are grounded through constant current sources, voltages of the other ends 6b and 7b of the series circuit 6 and the series circuit 7 are measured. It is to be noted that the number of diodes constituting each of the diode-type temperature sensors 2 and 3 as described above is not necessarily one, but one each temperature sensors 2 and 3 may include a plurality of diodes. With use of the temperature sensors 2 and 3 including a plurality of diodes, a large output can be obtained, thus allowing high sensitivity.

As thus described, the infrared array sensor 1 includes the row-direction series circuits 6 in which the first temperature sensors 2 on each row are electrically connected in series, and electric properties of the first temperature sensor 2 in each pixel change in accordance with a temperature change that occurs due to incidence of infrared rays. Therefore, in a case where the pixel 5 is present where a temperature change has occurred, a change occurs on an electric signal taken out of the row-direction series circuit 6 on a row including the pixel 5, whereby it is possible to specify a row including the pixel 5 where the change has occurred on incidence of infrared rays. Further, similarly, since the column-direction series circuit 7 is included, it is possible to specify a column including the pixel 5 where the change has occurred on incidence of infrared rays. It is thereby possible to detect whether or not a change has occurred on incidence of infrared rays. Further, in a case where the number of heaters having caused occurrence of the change on incidence of infrared rays is one within the field of view and the size of the heater when imaged on the sensor is on the order of one pixel or not larger than that, the pixel 5 where the change has occurred on incidence of infrared rays can be specified, so that the position of the heater can be uniquely specified. Moreover, in a case where the heater having caused occurrence of the change in incidence of infrared rays has a size exceeding the order of one pixel when imaged on the sensor, it is possible to specify the extension or the number of the pixel 5 where the change has occurred on incidence of infrared rays, or as the case may be, the position thereof. Hence it is possible to perform positional specification and tracking of the object T to be detected at low cost to some extent without performing image processing. Moreover, there is an advantage that, by constituting each of the temperature sensors 2 and 3 of any of a thermopile-type temperature sensor, a resistance bolometer-type temperature sensor, and a diode-type temperature sensor which do not require cooling and can be operated at a constant temperature, it is possible to give a non-cooling type infrared array sensor 1, and also realize simplification, size reduction and low power supply consumption of the infrared array sensor 1.

In addition, it is preferable if the electric properties of the first and second temperature sensors 2 and 3 change equivalently in accordance with a temperature change that occurs due to incidence of the infrared rays, it becomes possible to configure in a simplified manner the means for processing electric signals taken out of the row-direction series circuit 6 and the column-direction series circuit 7, and also to prevent deterioration in detection accuracy of the infrared array sensor 1 due to variations of sensitivity of the sensors 2 and 3.

Figure 4:
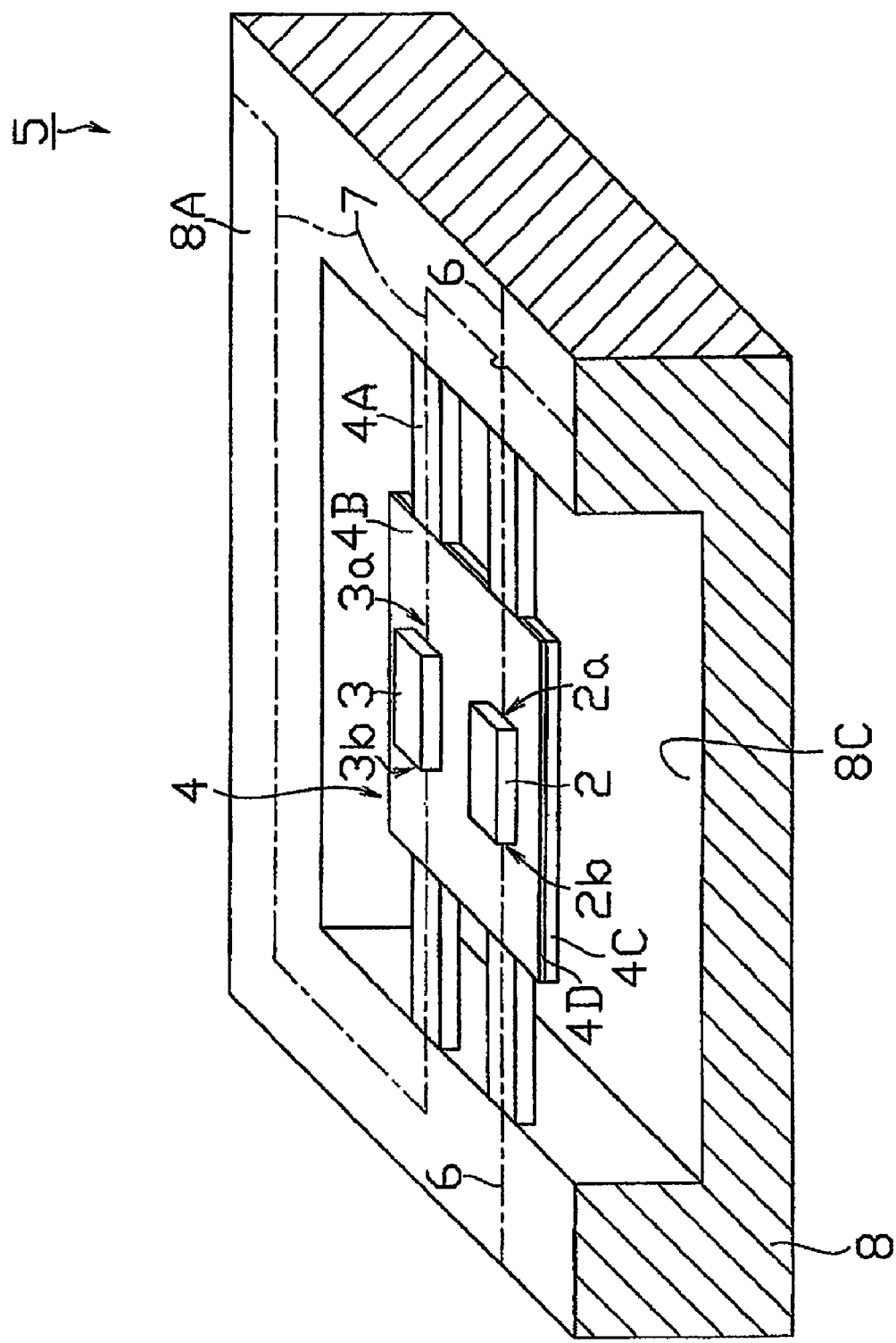
FIG. 4 is a schematic sectional perspective view showing a constitutional example of pixels 4 in the infrared array sensor 1.

The respective pixels 5 in the infrared array sensor 1 include, for example as shown in FIG. 4, a substrate 8 including a monocrystal silicon substrate or the like, and the thermal infrared sensors 4 arrayed on this substrate 8, as main constitutional elements. The substrate 8 in every pixel 5 may include one monocrystal silicon substrate, or the substrate 8 in only one pixel or a plurality of pixels 5 may include in common one monocrystal silicon substrate.

The thermal infrared sensor 4 is configured such that the first temperature sensor 2 having two terminals 2a and 2b and the second temperature sensor 3 having two terminals 3a and 3b are provided on a detector structure 4B supported, for example, through four leg sections 4A on the substrate 8 as a heat sink.

The detector structure 4B is made up of, for example, a foundation plate 4C and an infrared-rays absorption layer 4D laminated on the foundation plate 4C, and in order to have high thermal resistance, the detector structure 4B is provided so as to form one surface with the upper surface 8A of the substrate 8 through respective two leg sections 4A on the right and left sides of the substantial center within a depression 8C formed on the upper surface 8A of the substrate 8. Such an infrared-ray absorption layer 4D may be provided on each of the temperature sensors 2 and 3 in place of, or along with, the top of the detector structure 4B. In either manner, the infrared-ray absorption layer 4D may be provided at an appropriate position so as to be in contact with the temperature sensors 2 and 3. It should be noted that the thermal resistance mentioned here refers to a physical quantity that represents resistance to thermal conduction from the detector structure 4B to the substrate 8. Further, the number of leg sections 4A is not restricted to four, but at least one leg section 4A may support the detector structure 4B. Moreover, when the depression 8C is not provided on the upper surface 8A of the substrate 8, the detector structure 4B may be supported in the air over the substrate 8 through at least one leg section 4A.

It is to be noted that the electric properties of the temperature sensors 2 and 3 change in accordance with a temperature change in the detection region thermally independent in each pixel 5. Namely, the configuration of the pixel 5 is not restricted to the configuration shown in FIG. 4 so long as the temperature sensors 2 and 3 detect a temperature change in the detection region thermally independent in each pixel 5. For example, the detector structure 4B may be supported over the substrate 8 by a support having high thermal resistance.

Here, although not shown, it is preferable that the infrared array sensor 1 include: a peak row detection circuit that detects a row with the maximum difference between an output taken out of each column-direction series circuit 6 in a first state and an output taken out of each column-direction series circuit 6 in a second state; and/or a peak column detection circuit that detects a column with the maximum difference between an output taken out of the column-direction series circuit 7 in the first state and an output taken out of the column-direction series circuit 7 in the second state. For example, the peak row detecting circuit detects: a row with the maximum difference between an output taken out of both ends 6a and 6b of each column-direction series circuit 6 when the object T to be detected is not detected and an output taken out of each column-direction series circuit 6 when the object T to be detected is detected; and a column with the maximum difference between an output taken out of both ends 7a and 7b of each column-direction series circuit 7 when the object T to be detected is not detected and an output taken out of both ends when the object T to be detected is detected. It is thereby possible to specify a position of a thermal generation point as a temperature peak by units of pixels 5, so as to facilitate tracking of the object T to be detected. It should be noted that the peak row detecting circuit and the peak column detecting circuit may be provided within a chip including the infrared array sensor 1, or may be provided outside the chip.

Further, although not shown, it is preferable that the infrared array sensor 1 include: a peak row position detecting circuit that fits a difference between an output taken out of each row-direction series circuit 6 in a first state and an output taken out of each row-direction series circuit 6 in a second state to a function, and detects a position of a row with a value of the difference-fitted function being the maximum; and/or a peak column position detecting circuit that fits a difference between an output taken out of each column-direction series circuit 8 in the first state and an output taken out of each column-direction series circuit 8 in the second state to a function, and detects a position of a column with a value of the difference-fitted function being the maximum. For example, the peak row position detecting circuit fits a difference between an output taken out of both ends 6a and 6b of each row-direction series circuit 6 when the object T to be detected is not detected, and an output taken out of both ends 6a and 6b of each row-direction series circuit 6 when the object T to be detected is detected, and detects a position of a row with a value of the difference-fitted function being the maximum, and the peak column position detecting circuit fits a difference between an output taken out of both ends 7a and 7b of each column-direction series circuit 7 when the object T to be detected is not detected, and an output taken out of both ends 7a and 7b of each column-direction series circuit 7 when the object T to be detected is detected, and detects a position of a column with a value of the difference-fitted function being the maximum. It is thereby possible to obtain a point of the maximum output (e.g. row: 1.9, column: 1.1), a position of a thermal generation point as a temperature peak, with accuracy of length smaller than a pitch between the pixels, so as to improve accuracy in positional specification of the thermal generation point. Examples of the function may include a regular distribution function, which is a typical distribution function. It should be noted that the peak row position detecting circuit or the peak column position detecting circuit may be provided within a chip including the infrared array sensor 1, or may be provided outside the chip.

Further, although not shown, when an amplifier that amplifies an output taken out of both ends 6a and 6b of each row-direction series circuit 6 is provided on each row and an amplifier that amplifies an output taken out of both ends 7a and 7b of each column-direction series circuit 7 is previously provided on each column, it is possible to output a larger electric signal. In the case of mounting the amplifier as thus described, a transistor production process necessary for producing the amplifier may be added to production processes necessary for manufacturing the infrared array sensor 1. However, since the amplifier is not essentially provided, the amplifier may not be provided to reduce the number of production processes so as to further lower the cost. It should be noted that the amplifier may be provided within a chip including the infrared array sensor 1, or may be provided outside the chip.

Further, although not shown, when a configuration is previously formed such that an output from each row-direction series circuit 6 and an output from each column-direction series circuit 7 are made through an integration circuit, it is possible to reduce a signal frequency band, so as to improve an S/N (SN ratio). It should be noted that the integration circuit may be provided within a chip including the infrared array sensor 1, or may be provided outside the chip.

Further, although not shown in the figure, when a configuration is previously formed such that an output from each of the row-direction series circuit 6 and an output from each column-direction series circuit 7 are made through a comparator, it is possible to form a configuration such that positional detection of the object T to be detected is performed only in a case where the output from each row-direction series circuit 6 or the output of each column-direction series circuit 7 exceeds a set level. It should be noted that the comparator may be provided within a chip including the infrared array sensor 1, or may be provided outside the chip.

Moreover, there may occur a problem in that an appropriate electric signal cannot be obtained due to variations of sensitivity caused by a difference in electric properties or adiabatic properties of the temperature sensors 2 and 3 in each pixel 5. Therefore, when a correction circuit (not shown) that corrects an output from each row-direction series circuit 6 is previously provided on each row and a correction circuit (not shown) that corrects an output from each column-direction series circuit 7 is previously provided on each column, a further appropriate electric signal can be outputted so that the problem as described above can be prevented from occurring. It should be noted that the correction circuit may be provided within a chip including the infrared array sensor 1, or may be provided outside the chip.

Further, in a case where the temperature sensors 2 and 3 are not sensors using a difference in temperature between the substrate 8 and the detector structure 4B portion within the pixel 5 as in the case of the thermopile-type sensor, there may occur a problem in that an output varies due to a temperature change in the substrate 8, but when a row and a column made up of pixels not having an adiabatic structure, or a row and a column made up of pixels not absorbing infrared rays, are previously provided and variation correction circuits (not shown) are provided which correct output variations of each row and each column due to the temperature change in the substrate 8 by reading an output of each row and each column with the provided row and column taken as references, or some other means, it is possible to prevent the problem as described above from occurring. It should be noted that the variation correction circuit may be provided within a chip including the infrared array sensor 1, or may be provided outside the chip.

Moreover, when a configuration is previously formed such that an output from each row-direction series circuit 6 and an output from each column-direction series circuit 7 are all read in parallel, it is possible to realize reading of a signal per pixel 5 at higher speed than in the conventional system that successively reads the signal, so as to allow high-speed operation image processing. Further, when a configuration is previously formed such that signals are outputted in parallel, it is possible to realize a high-speed operation.

On the other hand, when the parallel reading is not performed and a system in which an output from each row and an output from each column are multiplexed and read is adopted, reading only 2N signals is necessary in the system of the present invention when there is N×N pixels 5 as compared with the conventional system in which reading N×N signals is necessary, whereby it is possible to perform high-speed reading in the case of using the same clock frequency as in the conventional system. Moreover, when the operation is performed using the same frame rate as in the conventional system, it is possible to narrow a signal band of the output, so as to lower a noise.

In addition, when the infrared array sensor 1 is used in place of a monopixel current-correction infrared sensor that is built in a conventional infrared sensor currently used for detecting a human body, in the conventional system, since an image of a high-temperature object is picked up in part of a large pixel, a temperature of the whole pixel is an average temperature of a background temperature region image accounting for a large part of the pixel and the high-temperature object image accounting for the part thereof and hence the effect of the presence of the high-temperature object is weakened, whereas in the infrared array sensor 1 according to the present invention, the image of the high-temperature object is picked up in the whole or a large area of one out of a plurality of pixels 5 or an adjacent plurality of pixels 5, and a temperature change in the pixel 5 where the image of the high-temperature body has been picked up is larger than in the conventional system, and hence the sensitivity (S/N ratio) can be improved.

Figure 5:
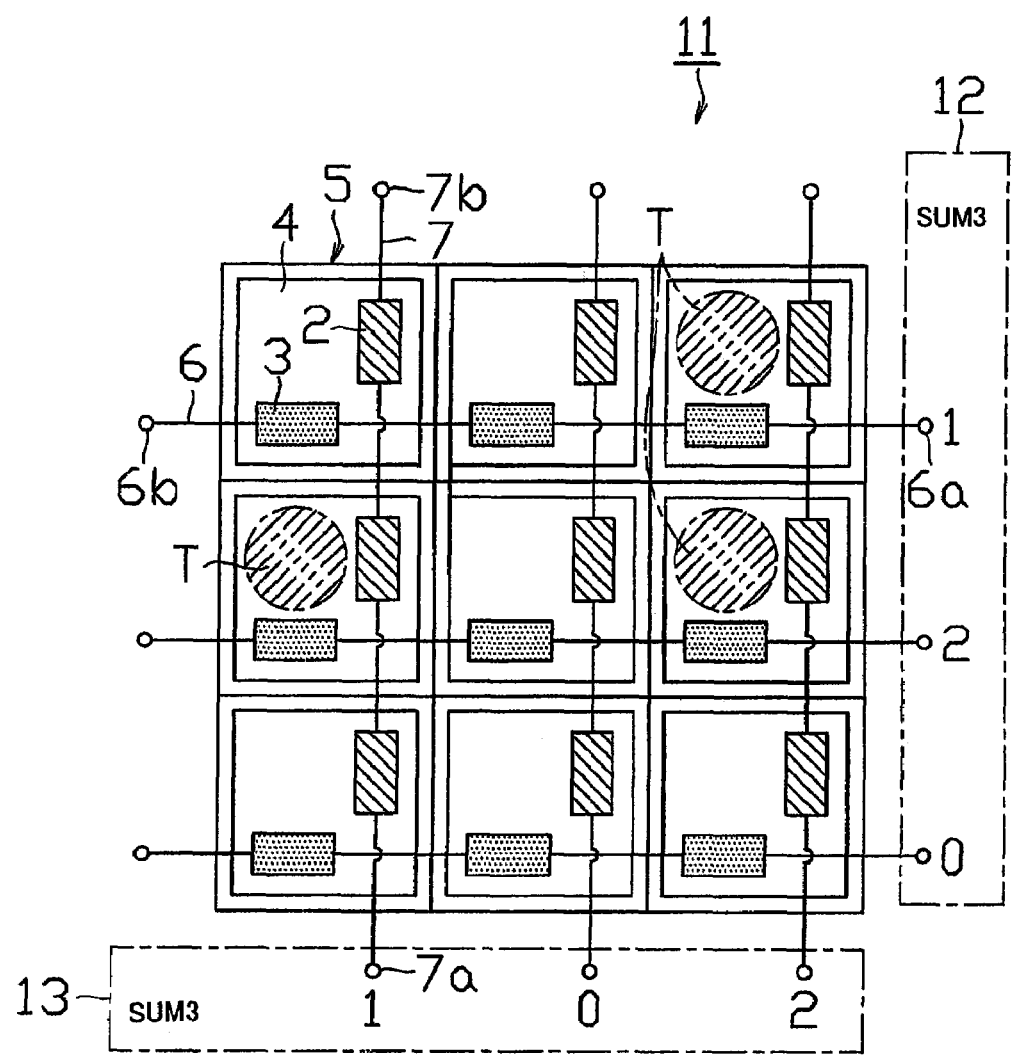
FIG. 5 is a schematic circuit diagram for explaining a state of detecting the object T to be detected in the infrared array sensor 11 according to a second embodiment.

In the following, an infrared array sensor 11 according to a second embodiment of the present invention is described based upon the drawing. As shown in FIG. 5, in addition to the configuration of the infrared array sensor 1 according to the first embodiment, the infrared array sensor 11 further includes a row additional circuit 12 and a column additional circuit 13.

The row additional circuit 12 adds on every row a difference between an output taken out of each row-direction series circuit 6 in a first state and an output taken out of each row-direction series circuit 6 in a second state. For example, the row additional circuit 12 adds on every row a difference between an output taken out of both ends 6a and 6b of each row-direction series circuit 6 when the object T to be detected is not detected and an output taken out of both ends 6a and 6b of each row-direction series circuit 6 when the object T to be detected is detected.

The column additional circuit 13 adds on every column a difference between an output taken out of each column-direction series circuit 7 in the first state and an output taken out of each column-direction series circuit 7 in the second state. For example, the column additional circuit 13 adds on every column a difference between an output taken out of both ends 7a and 7b of each column-direction series circuit 7 when the object T to be detected is not detected and an output taken out of both ends 7a and 7b of each column-direction series circuit 7 when the object T to be detected is detected.

It should be noted that the row additional circuit 12 and the column additional circuit 13 may be provided within a chip including the infrared array sensor 11, or may be provided outside the chip. Further, both the row additional circuit 12 and the column additional circuit 13 are provided as in the present embodiment, or either thereof may be provided. In the case of providing both the row additional circuit 12 and the column additional circuit 13, an area of the object T to be detected can be measured based upon either a larger value or a smaller value between the added value of all the rows and the added value of all the columns, an average value of both the added values, or a sum of both the added values.

Next, an operation of the infrared array sensor 11 is described based upon FIG. 5. It is to be noted that the operation of the infrared array sensor 11 is similar to that of the infrared array sensor 1 according to the first embodiment, and "0", "1" and "2" in FIG. 5 conceptually represent output levels taken out of each row-direction series circuit 6 and each column-direction series circuit 7. "0" represents a case where the object T to be detected is not present within a detection area of any pixel 5 included in each row or each column, and "1" represents a case where the object to be detected is present in the object region of only one pixel 5 included in each row or each column. When the object T to be detected is an object with almost the same temperature, as a human body and the like, a level of an output taken from each pixel 5 within the detection region is almost the same. Therefore, a level of an output taken out in the case of the object T to be detected being present within detection areas of two pixels 5 included in each row or each column is represented by "2" as twice as large as the level "1" of an output taken out in the case of the object T to be detected being in the detection region of one pixel 5 included in each row or each column.

For example, when respective pixels 5, which are located on the first row and the third column, the second row and the first column, and the second row and the third column, detect the objects T to be detected, values of outputs taken out of the row-direction series circuits 6 on the first and second rows and values of outputs taken out of the column-direction series circuits 7 on the first and third rows increase.

Outputs of all rows are added by the row additional circuit 12. Outputs of all columns are added by the column additional circuit 13. In this case, an area (size) of the object T to be detected is specified in accordance with the added value of all the rows and/or the added value of all the columns.

As thus described, according to the infrared array sensor 11, there is an advantage in that it is possible to measure an area of the object T to be detected, other than similar advantages to those of the infrared array sensor 1 according to the first embodiment. It is at least possible to easily specify the area of the object T to be detected to not larger than a prescribed degree.

Figure 6:
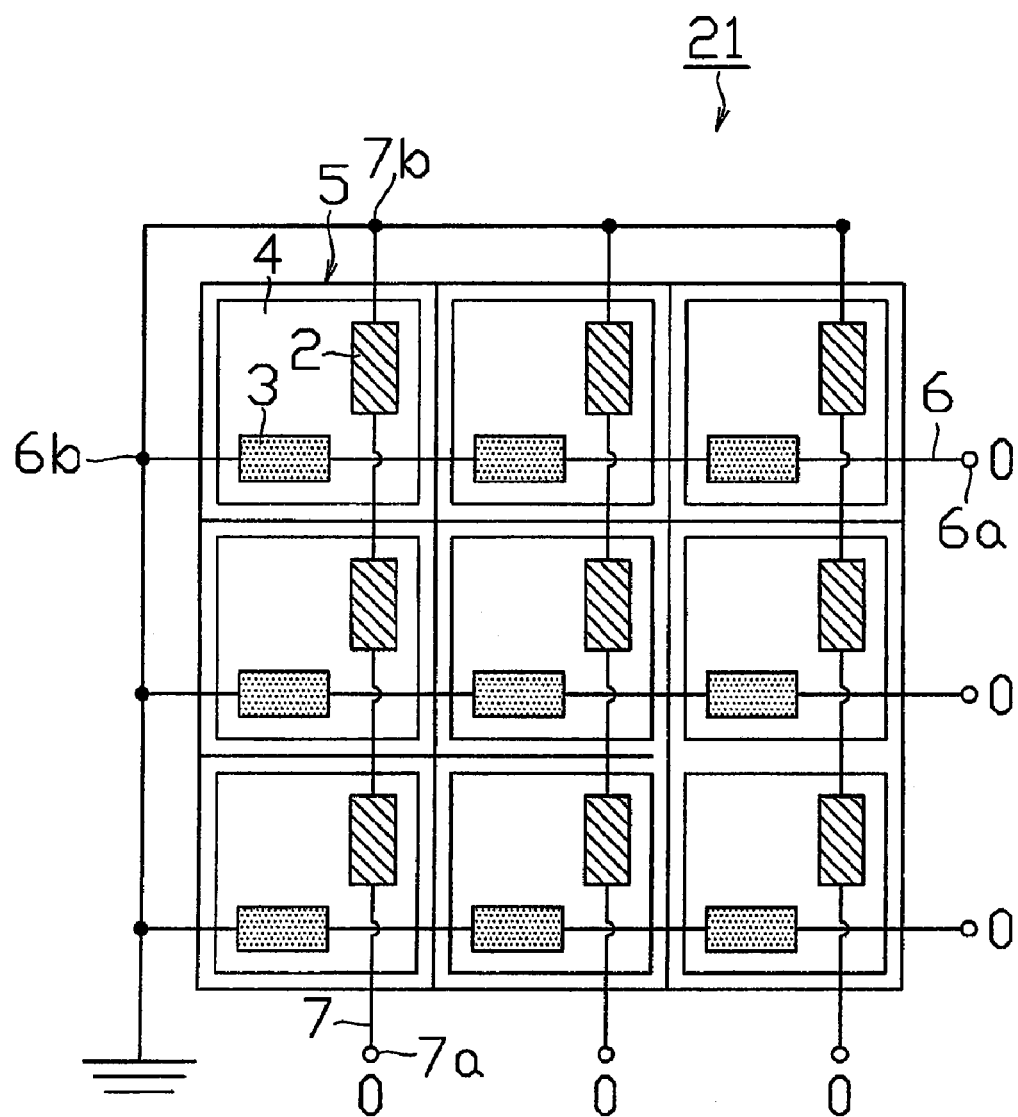
FIG. 6 is a schematic circuit diagram of an infrared array sensor 21 according to a third embodiment.

In the following, an infrared array sensor 21 according to a third embodiment of the present invention is described based upon the drawing. As shown in FIG. 6, in addition to the configuration of the infrared array sensor 1 according to the first embodiment, the infrared array sensor 21 has a configuration where one end 6b of each row-direction series circuit 6 and one end 7b of each column-direction series circuit 7 are all short-circuited. Although the short-circuited one ends 6b and 7b are connected to a ground level in FIG. 6, they may be connected to the power supply.

According to such an infrared array sensor 21, wiring for taking out outputs from each row-direction series circuit 6 and each column-direction series circuit 7 can be reduced, and hence there is the advantage of becoming easy to assemble, other than the similar advantages to those of the infrared array sensor 1 according to the first embodiment. It is to be noted that also in the present embodiment, the configuration according to the second embodiment can be adopted according to need.

Figure 7:
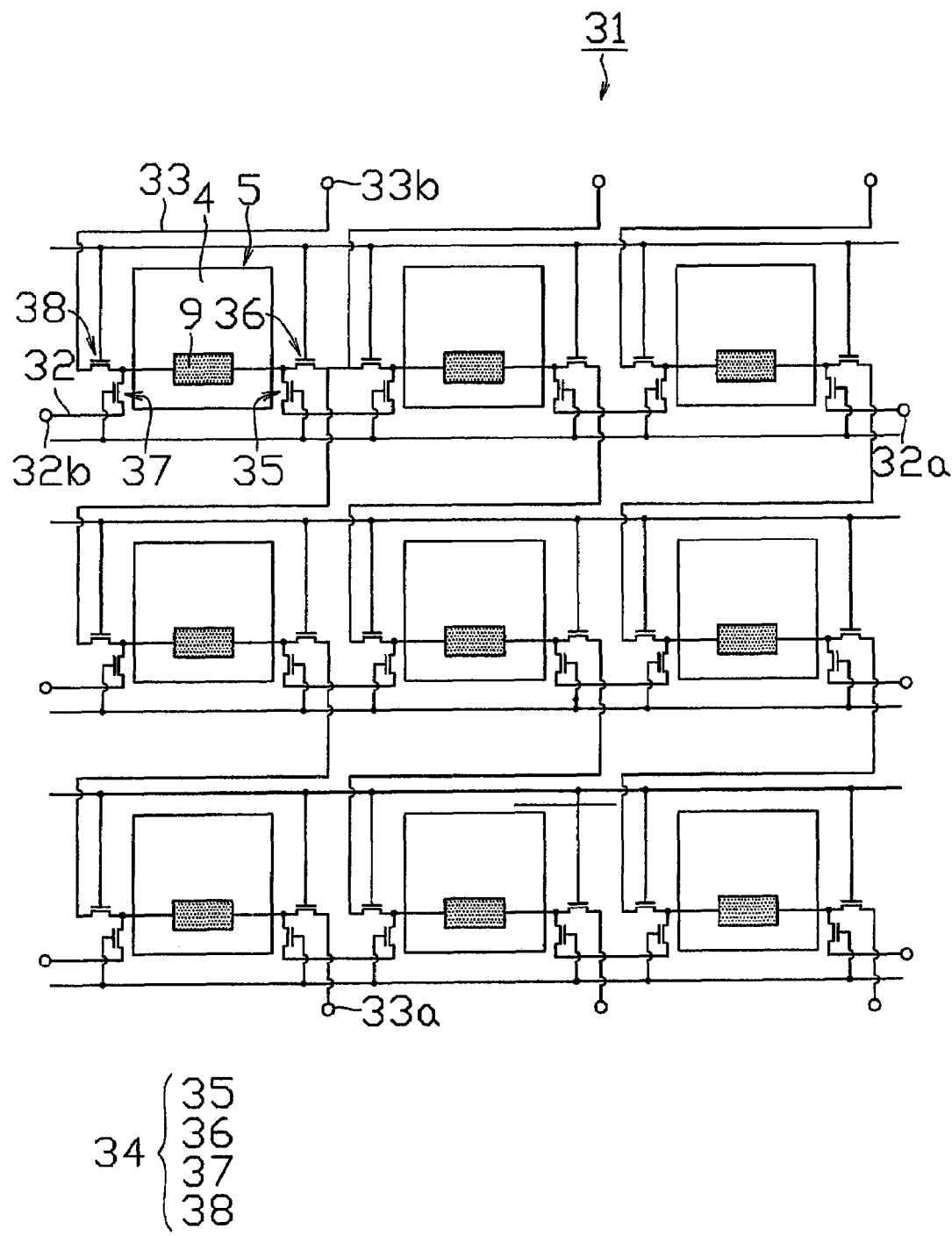
FIG. 7 is a main-portion extended schematic circuit diagram of an infrared array sensor 31 according to a fourth embodiment.
Figure 8:
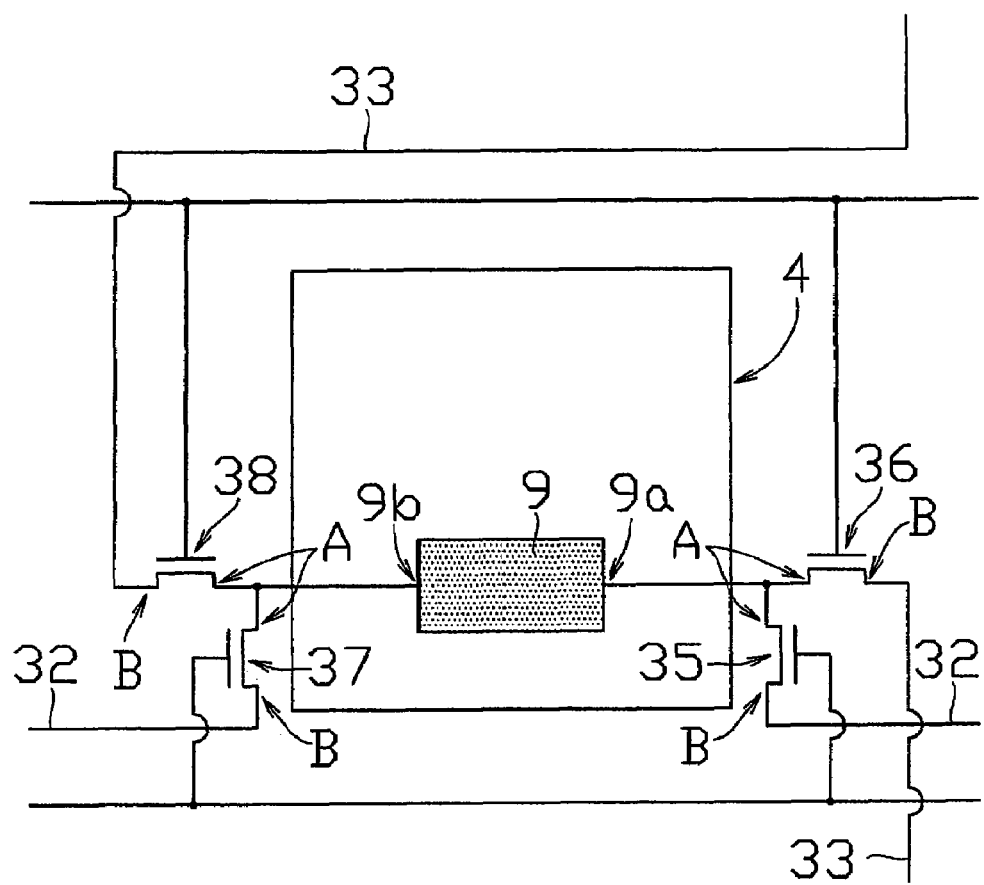
FIG. 8 is an expanded view of a portion of one pixel 4 in the infrared array sensor 31.

In the following, an infrared array sensor 31 according to a fourth embodiment of the present invention is described based upon the drawings. As shown in FIGS. 7 and 8, the infrared array sensor 31 has almost the same configuration as that of the infrared array sensor 1 according to the first embodiment, but the thermal infrared sensor 4 of each pixel 5 has only one temperature sensor 9.

In the infrared array sensor 31, the pixels 5 each having the thermal infrared sensor 4 that includes the temperature sensor 9 are arrayed in constant current matrix form, and the infrared array sensor 31 includes: row-direction series circuits 32 in each of which the temperature sensors 9 are electrically connected in series; column-direction series circuits 33 in each of which the second temperature sensor 9 are electrically connected in series; and switching means 34 for switching a state in which each row-direction series circuit 32 is electrically connected and every electric connection of the temperature sensors 9 between different columns is cut to and from a state where each column-direction series circuit 33 is electrically connected and every electric connection of the temperature sensors 9 among rows is cut. Between the temperature sensors 9 in the pixels 5 which are adjacent respectively in a row direction or a column direction, switching transistors 35, 36, 37 and 38 are electrically connected in series, and the switching means 34 switches the above state by turning ON/OFF the switching transistors by means of two control signals.

More specifically, the infrared array sensor 31 is configured such that the thermal infrared sensor 4 of each pixel 5 is provided with the temperature sensor 9 having the first and second terminals 9a and 9b, a surface of the substrate 8 of each pixel 5 is provided with the first, second, third and fourth switching transistors 35, 36, 37 and 38 each having a first and second input/output terminals A and B, the respective first input/output terminals A of the first and second switching transistors 35 and 36 of each pixel 5 are connected to the first terminal 9a of the temperature sensor 9, the respective first input/output terminals A2 of the third and forth switching transistors 37 and 38 of each pixel 5 are connected to the second terminal 9b of the temperature sensor 9, the second input/output terminals B of the first and third switching transistors 35 and 37 of the pixels 5 which are adjacent in the row direction are connected in series to provide the row-direction series circuit 32 in each row, the second input/output terminals B of the second and fourth switching transistors 36 and 38 of the pixels 5 which are adjacent in the column direction are connected in series to provide the column-direction series circuit 33 in each column, and the first and third switching transistors 35 and 37 are driven by a first ON/OFF control signal and the second and fourth switching transistors 36 and 38 are driven by a second ON/OFF control signal, so that both ends 32a and 32b of each row-direction series circuit 32 are taken out respectively as outputs when the first and third switching transistors 35 and 37 are turned ON by the first ON/OFF control signal, and both ends 33a and 33b of each column-direction series circuit 33 are taken out respectively as outputs when the second and fourth switching transistors 36 and 38 are turned ON by the second ON/OFF control signal.

The kind of the switching transistors 35, 36, 37 and 38 is not particularly restricted, but a CMOS (Complementary Metal-Oxide Semiconductor) and the like are suitable. The first and second ON/OFF control signals may be configured so as to be outputted by an ON/OFF control section, not shown, and may be controlled such that a state where the first and third switching transistors 35 and 37 are turned ON by the first ON/OFF control signal and a state where the second and forth switching transistors 36 and 38 are turned ON by the second ON/OFF control signal do not overlap.

The basic operation of the infrared array sensor 31 is similar to that of the infrared array sensor 1 according to the first embodiment except in that the connection between each row-direction series circuit 32 and each column-direction series circuit 33 is switched by the switching transistors 35, 36, 37 and 38 in every set time. Further, also in the present embodiment, the configuration according to the second embodiment or the third embodiment can be adopted according to need.

As thus described, according to the infrared array sensor 31, other than the similar advantages to those of the infrared array sensor 1 according to the first embodiment, there is an advantage in that it is possible to simplify the number and wiring of the temperature sensors to be used and also to reduce thermal conductance so as to realize high sensitivity.

Figure 9:
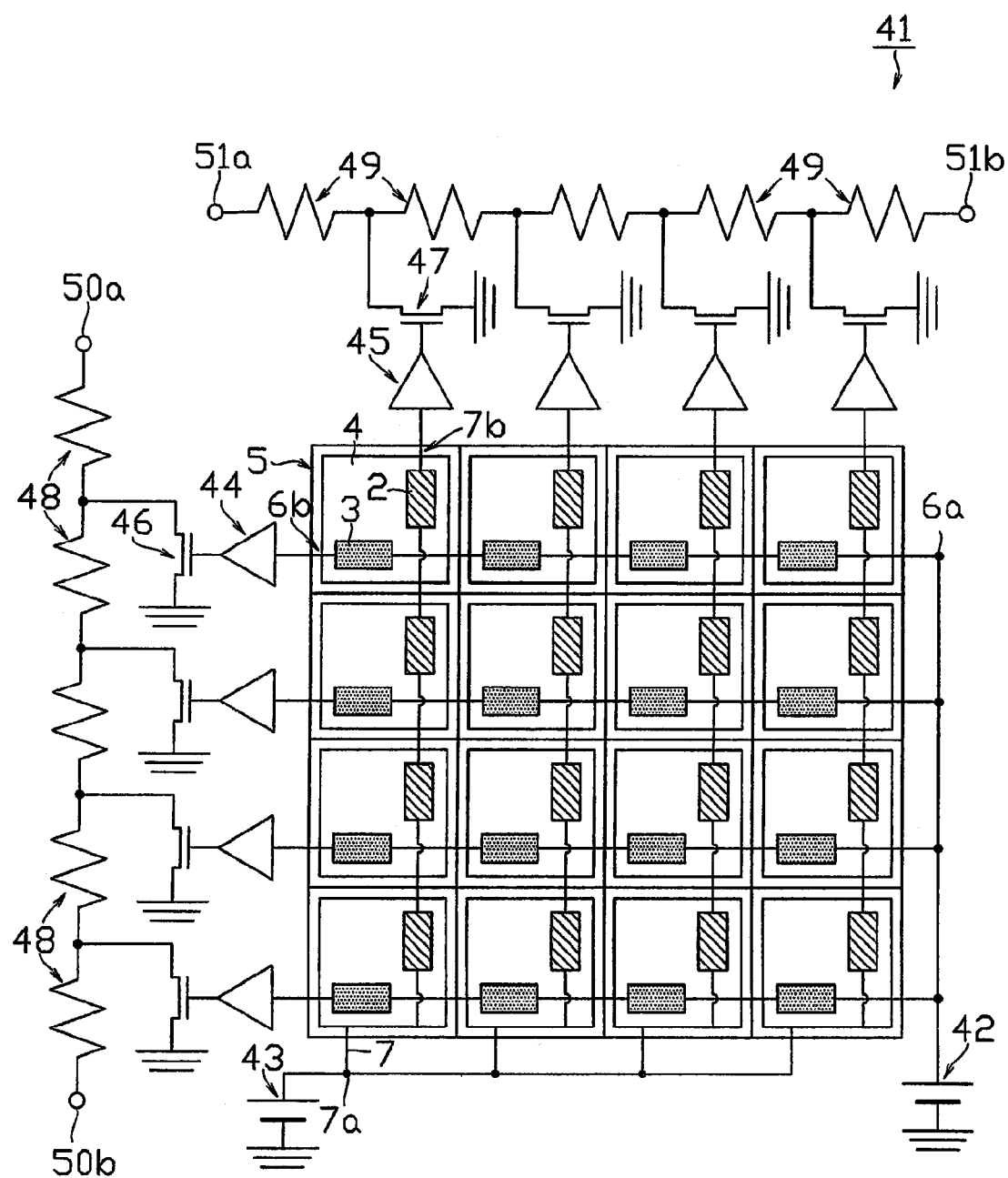
FIG. 9 is a schematic circuit diagram of an infrared array sensor 41 according to a fifth embodiment.

In the following, an infrared array sensor 41 according to a fifth embodiment of the present invention is described based upon the drawing. The infrared array sensor 41 includes peak row detecting circuits and peak column detecting circuits. As shown in FIG. 9, in the infrared array sensor 41, power supplies 43 and 44 are added to one ends 6a and 7a of the row-direction series circuit 6 and the column-direction series circuit 7 in the infrared array sensor 1 according to the first embodiment, and the other ends 6b and 7b are connected to gate electrodes of MOS transistors 46 and 47 provided on each row and column through amplifiers 44 and 45 provided on each row and column.

Source electrodes of the MOS transistors 46 and 47 are grounded, and adjacent drains of the MOS transistors 46 and 47 are connected through resistors 48 and 49, and drains of the MOS transistors 46 and 47 at the outermost ends are connected to output terminals 50*a*, 50*b*, 50*c* and 50*d* through the resistors 48 and 49. In addition, it is assumed that every resistance value of each resistor 48 and each resistor 49 is equivalent. As thus described, the peak row detecting circuit is configured as a circuit including the amplifier 44, the resistor 48, and the output terminals 50*a* and 50*b*, and the peak column detecting circuit is configured as a circuit including the amplifier 45, the resistor 49, and output terminals 51*a* and 51*b*.

Although the infrared array sensor 41 is a thermopile-type temperature sensor in terms of the form of the temperature sensor 2 and 3, the resistance bolometer-type temperature sensor or the diode-type temperature sensor may also be used by changing the drive system for operating the temperature sensor 2 and 3 and the signal acquirement system.

The first temperature sensors 2 are connected in series on each row, and the row-direction series circuit 6 is formed of, for example, four first temperature sensors 2 connected in series on each row. One end 6*a* of each row-direction series circuit 6 is grounded through the power supply 42, and the other end 6*b* is connected with the amplifier 44. A sum of outputs of the first temperature sensors 2 on each row is inputted in the amplifier 44. Meanwhile, the second temperature sensors 3 are connected in series on each column, and the column-direction series circuit 7 is formed of, for example, four second temperature sensors 3 connected in series on each column. One end 7*a* of each column-direction series circuit 7 is grounded through the power supply 43, and the other end 7*b* is connected with the amplifier 45. A sum of outputs of the second temperature sensors 3 on each column is inputted in the amplifier 45. It is to be noted that, although the amplifiers 44 and 45 are in such a form that outputs of one ends 6*b* and 7*b* of the row-direction series circuit 6 and the column-direction series circuit 7 are used as input signals, differential amplifiers may be employed, and both ends 6*a*, 6*b*, 7*a*, 7*b* of the row-direction series circuit 6 and the column-direction series circuit 7 may be used as input signals.

The range of each terminal voltage of the MOS transistors 46 and 47 is designed so as to be a saturated region, and when a voltage between a gate and a source is decided, a drain current corresponding to the decided voltage flows between the drain and the source. It should be noted that, although the MOS transistor is used, when obtaining current outputs from the amplifiers 44 and 45 is made possible, a bipolar transistor can be used in place of the MOS transistor. The following explanation is given, assuming that the characteristics of the transistors (mutual conductance in the case of the MOS transistors) are equal, and the same current flows when the same gate voltage is inputted, but the transistors are not necessarily required to have the same characteristics.

In addition, the numbers of rows and the number of columns of the pixels 5 are not restricted to 4-rows×4-columns as shown in FIG. 9, but the numbers may be not smaller than two. Further, the number of rows and the number of columns of the pixels 5 are not necessarily required to be the same.

Figure 10:
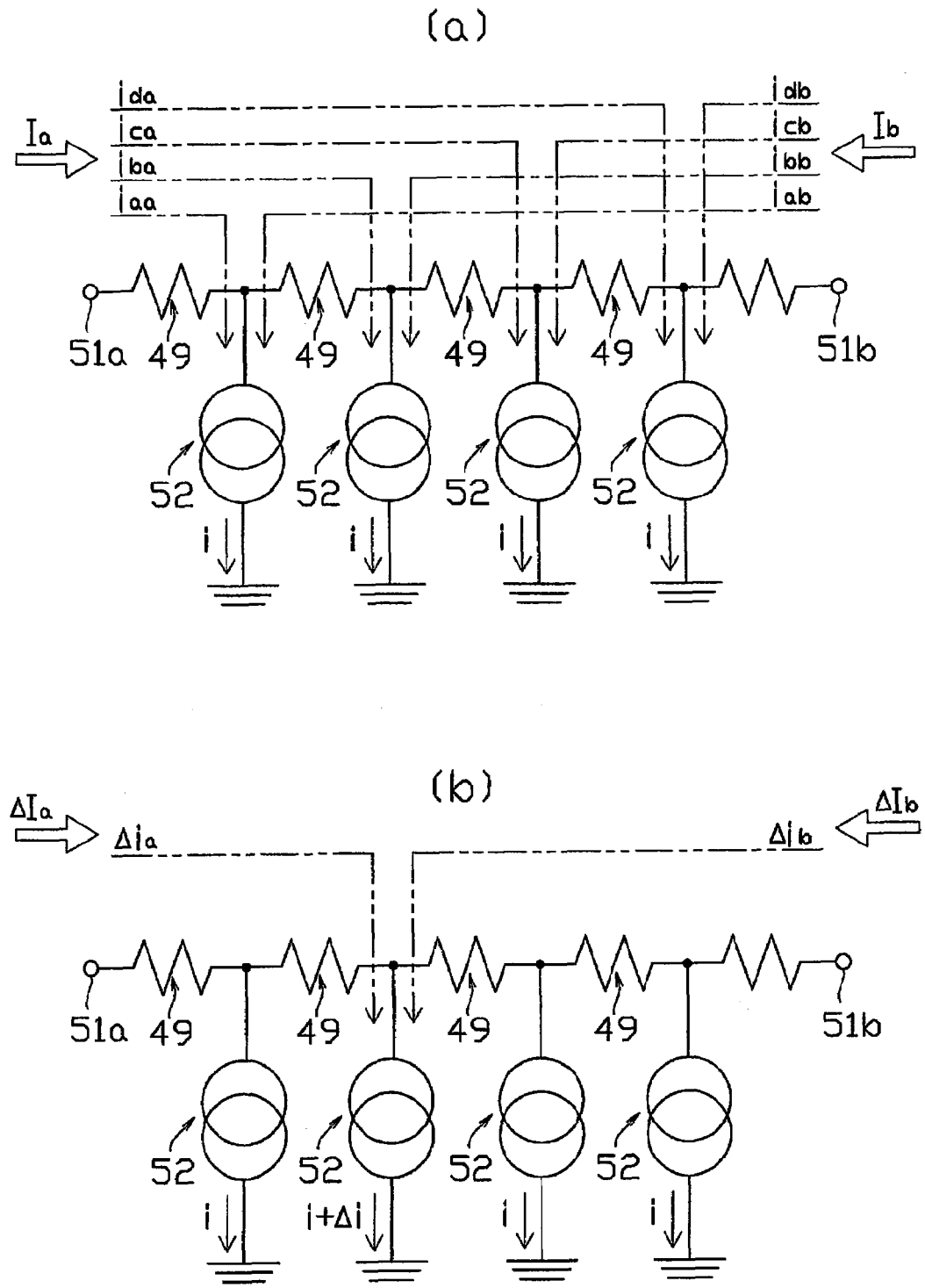
FIGS. 10a and 10b are views explaining operations of a current-type analog signal processing circuit in the infrared array sensor 41.

FIG. 10 is a view where the circuit for processing an additional signal on the row direction has been extracted, to explain its operation, and the MOS transistor 47 has been replaced by a constant current source 52 as an equivalent circuit. Further, a current component that flows into each MOS transistor 47 (constant current source 52) is also shown. FIG. 9 shows a state where the same electric signal is obtained from every column, and a value of a current flowing through each constant current source 52 is the same. The following description is given using the circuit that processes an additional signal on the column direction shown in FIG. 9, but a circuit that processes an additional signal in the row direction performs the similar operation.

Next, an operation of a signal reading circuit in the infrared array sensor 41 is described based upon FIGS. 9 and 10. First, a case is considered where an electric signal obtained from every column in FIG. 10(*a*) has the same size. It is assumed that the terminals 51*a* and 51*b* are connected with power supplies that supply the same voltage, although not shown. In this state, with the impedance of the constant current source being infinite, a constant current can be allowed to flow irrespective of a voltage at both ends and a current flowing through each current source is supplied from the voltage sources connected to the terminals 51*a* and 51*b*, and therefore, the current components are represented as follows when considered by being divided as in FIG. 10:

$$i=iaa+iab=iba+ibb=ica+icb=ida+idb,$$

$$Ia=iaa+iba+ica+ida,$$

$$Ib=iab+ibb+icb+idb$$

In order to decide each current component, a state is considered where only one constant current source is left and the portions having the other current sources are electrically opened. For example, for deciding iba and ibb, it is considered that only the current source second from the left is present. As for iba, the current is supplied from the power supply at the left-side terminal 51*a*, and reaches the constant current source through two resistors 49, while as for ibb, the current is supplied from the power supply at the right-side terminal 51*b*, and thus reaches the constant current source through three resistors 49. Since the voltages of the power supplies connected to both the terminals 51*a* and 51*b* are the same, voltage-falls in both channels need to be equal. Accordingly, $$iba:ibb=3:2$$

is established, and when the size of the current of the constant current sources is decided, iba and ibb can be decided. The other current components can be decided in the same manner, and the current of the whole circuit is obtained by addition of the individual current components obtained in the manner as described above, as shown in FIG. 10(*a*).

Next, FIG. 10(*b*) is considered. FIG. 10(*b*) is a view showing a state where the object T to be detected (heater) has been detected in any of pixels 5 on the row second from the left, as well as a state where an input to the MOS transistor 47 (constant current source 52) second from the left has increased from a state shown in FIG. 10(*a*) and a current has increased just by Δi. As the current components, only those corresponding to an increased current amount due to the increase in input to the MOS transistor 47 (constant current source 52) are shown. How this increased current amount is distributed to the right and left can also be obtained by considering only the constant current source with the size of Δi and reflecting it to a final calculation, and hence $$\Delta ia:\Delta ib=3:2$$

is established. In this case, the increased current amount Δia flowing from the left-side terminal 51*a* is equal to Δia, and the increased current amount Δib flowing from the right-side terminal 51*b* is equal to Δib. It is therefore found that the increased current amount on the left side is larger than the increase current amount on the right side.

Similarly, when only a current of the constant current source first from the left increases, $$\Delta ia:\Delta ib=4:1$$

is established; when only a current of the constant current source second from the right increases, $$\Delta ia:\Delta ib=2:3$$

is established; and when only a current of the constant current source first from the right increases, $$\Delta ia:\Delta ib=1:4$$

is established. As thus described, since current values divided to the right and left vary in accordance with the position of the increased current, measuring and comparing the increased current amounts on the right and the left sides can detect the position of the current source with its current having increased, resulting in that it is possible to see on which column a signal has increased, so as to specify a column where the object T to be detected is present. As for the row direction, positional specification of the object T to be detected can be performed by the similar operation. With the information of the row and column combined, it is possible to specify the position of the object T to be detected in the two-dimensional space.

Further, the area of the object T to be detected can be measured by measuring a sum of currents flowing into the terminals 50*a* and 50*b*, and a sum of currents flowing into the terminals 51*a* and 51*b* in the configuration of FIG. 10(*a*)

Figure 11:
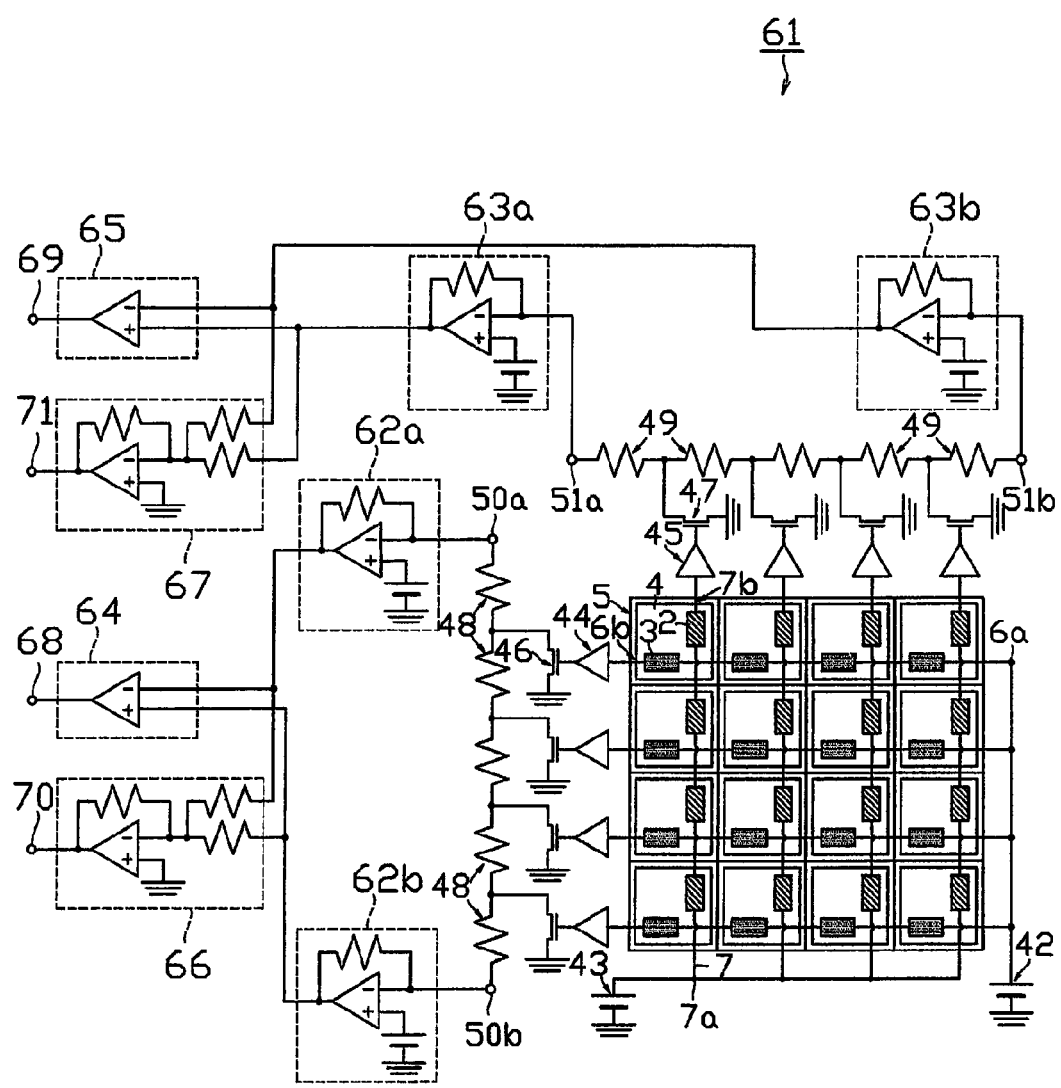
FIG. 11 is a schematic circuit diagram of an infrared array sensor 61 according to a sixth embodiment.

In the following, an infrared array sensor 61 according to a sixth embodiment of the present invention is described based upon the drawing. The infrared array sensor 61 includes peak row position detecting circuits and peak column detecting circuits. As shown in FIG. 11, the infrared array sensor 61 is configured such that current-voltage conversion amplifiers 62*a*, 62*b*, 63*a* and 63*b*, differential amplifiers 64 and 65, and additional circuits 66 and 67 are added to the terminals 50*a* and 50*b* and the terminals 51*a* and 51*b* in the infrared array sensor 41 according to the fifth embodiment. Terminals 68, 69, 70 and 71 are output terminals.

Next, the operation of the infrared array sensor 61 is described. The portions having the same configurations as those of the infrared array sensor 41 perform the operations described above. The current-voltage conversion amplifiers 62*a*, 62*b*, 63*a* and 63*b* supply constant voltages to the terminals 50*a*, 50*b*, 51*a* and 51*b*, and output voltages proportional to values of currents flowing into the terminals 50*a*, 50*b*, 51*a* and 51*b*. It is to be noted that circuits shown within dotted lines in FIG. 11 are trans-impedance amplifiers each using an operational amplifier, but since this circuit itself is commonly used, and hence a detailed description thereof is omitted here.

An output of each of the current-voltage conversion amplifiers 62*a*, 62*b*, 63*a* and 63*b* is divided into two, and the one output is inputted into the differential amplifier 64 or 65. For example, the differential amplifier 64 accepts the outputs of the current-voltage conversion amplifiers 62*a* and 62*b* as inputs, and outputs a difference between the inputted outputs. As described above, from this output, it is possible to specify a row where the object T to be detected is present. Similarly, the differential amplifier 65 accepts outputs of the current-voltage conversion amplifiers 63*a* and 63*b* as inputs, and outputs a difference between the inputted outputs. As described above, from this output, it is possible to specify a column where the object T to be detected is present can be specified. Accordingly, from the outputs 68 and 69 of the differential amplifiers 64 and 65, it is possible to specify the position of the object T to be detected in the two-dimensional space.

The other output of each of the current-voltage conversion amplifiers 62*a*, 62*b*, 63*a* and 63*b* is inputted into the additional circuit 66 or 67. For example, the additional circuit 66 accepts outputs of the current-voltage conversion amplifiers 62*a* and 62*b* as inputs, and outputs a sum of the inputted outputs. By making all resistance values of the additional circuits 66 and 67 equal, it is possible to obtain a value of a simple addition (with its polarity reversed). This added value is proportional to a sum of values of currents flowing into the terminals 50*a* and 50*b*, and it is possible from this added value to measure the area of the object T to be detected. Further, the similar measurement can also be performed by use of a signal obtained from the output terminal 71 of the additional circuit 67.

Figure 12:
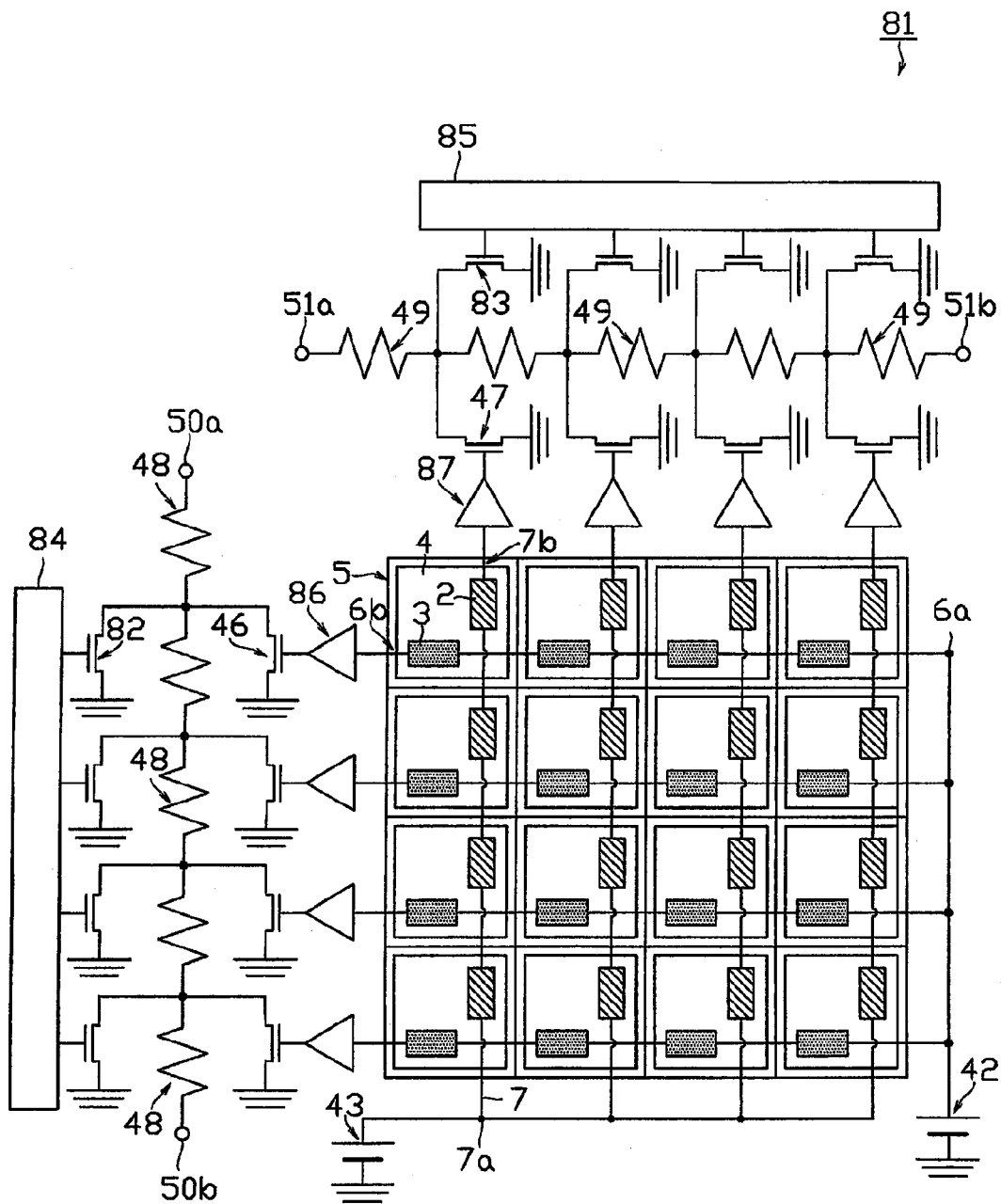
FIG. 12 is a schematic circuit diagram of an infrared array sensor 81 according to a seventh embodiment.

In the following, an infrared array sensor 81 according to a seventh embodiment of the present invention is described based upon the drawing. As shown in FIG. 12, the infrared array sensor 81 is configured such that MOS transistors 82 and 83, and correction data supply circuits 84 and 85 are added to the infrared array sensor 41 according to the fifth embodiment. The amplifiers 86 and 87 are amplifiers having the same function as in the first embodiment, but are amplifies that can be individually turned ON/OFF in accordance with signals inputted from terminals 88 and 89 at the time of acquiring correction data.

In the infrared array sensor, the temperature sensors 2 and 3 in each pixel 5 have different sensitivities, and even in the case of observing the object T to be detected which is uniformly radiating infrared rays, a difference occurs between outputs from the temperature sensors 2 and 3 of each pixel 5, and hence correction is required for obtaining a uniform output. Further, depending upon the usage of the temperature sensors 2 and 3, there are cases where a state where infrared rays are non-uniformly radiated is taken as a reference and a change from this state is intended to be observed. The infrared array sensor 81 is configured so as to satisfy such a requirement.

Next, the operation of the infrared array sensor 81 is described. The newly added MOS transistors 82 and 83 are operated by the constant current source in a saturated region as in the case of the MOS transistors 82 and 83. Therefore, as described above concerning FIG. 10, currents flowing through the MOS transistors 82 and 83 are divided to the left and right terminals 50*a* and 50*b* and terminals 51*a* and 51*b*, and flow through the MOS transistors 51 and 52 that allow currents, decided by a signal of the infrared array sensor 81, to flow.

The current flowing through the MOS transistor 82 generates the same effect as in the case shown in FIG. 10(*b*) where the current of the corresponding MOS transistor 51 with its drain connected to the same node increases or decreases. Therefore, for example when there are variations of currents flowing through the MOS transistor 51 in a state where the condition of being uniformly radiated with infrared rays is observed, a row through which the largest current is allowed to flow is taken as a reference, and a current amount insufficient from this reference is supplied in the MOS transistor 82 so that an output corresponding to the uniform state can be obtained. The amount of the current flowing through the MOS transistor 82 is given by applying correction data recorded in the correction data supply circuit 84 to a gate electrode of the MOS transistor 82. The similar operation can also be performed on the columns so that an output corresponding to the uniform state can be obtained.

The correction data recorded in the correction data supply circuit is obtained such that a signal to be added to the terminal 88 is changed in a state where the condition of being uniformly radiated with infrared rays is observed, only one of the MOS transistors 51 is brought into an operating state, a voltage to be given from the correction data supply circuit 84 to the MOS transistor 82 is changed, a sum of currents flowing into the terminals 50a and 50b is adjusted so as to become a target value, and at this time, a voltage to be supplied from the correction data supply circuit 84 to the MOS transistor 82 is stored as the correction data. This operation is performed on each row, and acquisition of all data to be stored into the correction data supply circuit 84 is completed. In the same manner, correction data as for the column direction can also be acquired.

When a state where infrared rays are uniformly radiated in the above operation is taken as a background state to serve as a reference, an output corresponding to a change from the reference can be obtained. Correction data in this case can also be acquired by taking an object to be observed at the time of acquiring the correction data as a background to serve as a reference.

INDUSTRIAL AVAILABILITY

As thus described, the infrared array sensor according to the present invention is suitable for realizing low cost, simplification, size reduction and low consumption power by allowing positional specification and flow tracking of an object to be detected without performing image processing. Further, the infrared array sensor configured so as to switch the connection between each row direction series circuit and each column direction series circuit by means of a switching transistor in each set time is suitable for reducing thermal conductance to realize high sensitivity by enabling reduction in the number of temperature sensors for use and the number of wires for the sensors. Moreover, the infrared array sensor small in the number of output terminals and thus easy to use can be realized by adding a current-type analog signal processing circuit, a current-voltage conversion amplifier, a differential amplifier, an additional amplifier, or a correction circuit.

The invention claimed is:

1. An infrared array sensor where pixels, each having a thermal infrared detector whose electric properties change in accordance with incidence of infrared rays, are arrayed in two-dimensional matrix form, said sensor comprising:
   a row output take-out means configured so as to take out an electric signal to the outside as an output, said electric signal being in accordance with electric properties as a sum of electric properties respectively shown by said thermal infrared detectors on each row; and
   a column output take-out means configured so as to take out an electric signal to the outside as an output, said electric signal being in accordance with electric properties as a sum of electric properties respectively shown by said thermal infrared detectors on each column;
   wherein the thermal infrared detectors are electrically connected in series on each row; and
   wherein the thermal infrared detectors are electrically connected in series on each column.

2. An infrared array sensor where pixels, each having a thermal infrared detector that includes first and second temperature sensors whose electric properties change in accordance with a temperature change that occurs due to incidence of infrared rays, are arrayed in two-dimensional matrix form so as to simultaneously observe the whole field of view, said sensor comprising:
   a row-direction series circuit in which said first temperature sensors are electrically connected in series on each row so as to take out an electric signal to the outside as an output, said electric signal being in accordance with electric properties as a sum of electric properties respectively shown by said first temperature sensors; and
   a column-direction series circuit in which said second temperature sensors are electrically connected in series on each column so as to take out an electric signal to the outside as an output, said electric signal being in accordance with electric properties as a sum of electric properties respectively shown by said second temperature sensors,
   wherein said temperature sensor includes of any of a thermopile-type temperature sensor, a resistance bolometer-type temperature sensor, and a diode-type temperature sensor.

3. The infrared array sensor according to claim 2, wherein electric properties of each of said temperature sensors equivalently change in accordance with a temperature change that occurs due to incidence of infrared rays.

4. The infrared array sensor according to claim 2, wherein electric properties of said temperature sensor change in accordance with a temperature change in a detection region thermally independent in each of said pixels.

5. The infrared array sensor according to claims 2, wherein said temperature sensor is provided on a detector structure supported on a substrate as a heat sink through a leg section.

6. The infrared array sensor according to claims 2, wherein every one end of each of said row-direction series circuits and/or every one end of each of said column-direction series circuits are short-circuited, and the short-circuited one ends are connected to a power supply or a ground level.

7. The infrared array sensor according to claims 2, wherein,
   said sensor has, on at least either each row or each column,
      a constant current source that allows a current to flow, said current being set in accordance with an input signal that is a signal taken out of each of said row-direction series circuits or each of said column-direction series circuits,
   a first terminal of each of said constant current sources is each connected to a constant potential,
   a second terminal of each of said constant current sources which are adjacent is connected to each other through a resistor, and
   the second terminal of each of said constant current sources on both the outermost rows and both the outermost columns is connected to a voltage source through a resistor.

8. The infrared array sensor according to claim 7, wherein a resistance value of each resistor, connected between the second terminals of said constant current sources that are adjacent on at least each row or each column, is all equivalent.

9. The infrared array sensor according to claim 7, wherein conversion properties of a current, allowed to flow with respect to an input signal of each of said constant current sources on at least each row or each column, are all equivalent.

10. The infrared array sensor according to claim 7, wherein power supply voltages of the voltage sources, connected to the second terminals of said constant current sources on both the outermost rows or both the outermost columns through the resistors, are equivalent.

11. The infrared array sensor according to claim 7, wherein
- a current-voltage conversion amplifier having a voltage source for supplying a constant voltage is connected to the resistor that is connected to each of said constant current sources being on at least both said outermost rows or both said outermost columns,
- output terminals of each of said current-voltage conversion amplifiers are connected respectively to a differential amplifier and an additional amplifier, and
- outputs of said differential amplifier and said additional amplifier are regarded as outputs of said sensor.

12. The infrared array sensor according to claim 7, wherein
- said sensor has, on at least either the row or the column, a second constant current source, a first terminal of which is connected to a node where a first constant current source capable of flowing a current is connected to a resistor column, said current being decided in accordance with a sum signal, the sum signal of the row or the column being as a control input signal, and the sensor has an input capable of controlling a current amount,
- a second terminal of said constant current source is connected to a fixed potential, and
- said sensor has a correction data supply circuit for supplying data for controlling the current amount of said constant current source.

13. The infrared array sensor according to claim 2, comprising:
- a peak column detection circuit that detects a column with the maximum difference between an output taken out of each of said column-direction series circuits in a first state and an output taken out of each of said column-direction series circuits in a second state; and/or
- a peak column detection circuit that detects a column with the maximum difference between an output taken out of said column-direction series circuit in the first state and an output taken out of said column-direction series circuit in the second state.

14. The infrared array sensor according to claim 2, comprising:
- a peak row position detecting circuit that fits a difference between an output taken out of each of said row-direction series circuits in a first state and an output taken out of each of said row-direction series circuits in a second state to a function, and detects a position of a row with a value of the difference-fitted function being the maximum; and/or
- a peak column position detecting circuit that fits a difference between an output taken out of each of said column-direction series circuits in the first state and an output taken out of each of said column-direction series circuits in the second state to a function, and detects a position of a column with a value of the difference-fitted function being the maximum.

15. The infrared array sensor according to claim 2, comprising:
- a row additional circuit that adds a difference between an output taken out of each of said row-direction series circuits in a first state and an output taken out of each of said row-direction series circuits in a second state to every row; and/or
- a column additional circuit that adds a difference between an output taken out of each of said column-direction series circuits in the first state and an output taken out of each of said column-direction series circuits in the second state to every column.

16. The infrared array sensor according to claim 2, wherein each of said temperature sensors comprises any of a thermopile-type temperature sensor, a resistance bolometer-type temperature sensor, and a diode-type temperature sensor.

17. An infrared array sensor where pixels, each having a thermal infrared detector that includes one temperature sensor whose electric properties change in accordance with a temperature change that occurs due to incidence of infrared rays, are arrayed in two-dimensional matrix form, said sensor comprising:
- a row-direction series circuit in which said temperature sensors are electrically connected in series on each row;
- a column-direction series circuit in which said temperature sensors are electrically connected in series on each column; and
- a switching means for switching a state where each of said row-direction series circuits is electrically connected and all electric connections of said temperature sensors among different columns are cut to and from a state where each of said column-direction series circuits is electrically connected and all electric connections of said temperature sensors among rows are cut.

18. The infrared array sensor according to claim 17, wherein
- switching transistors are electrically connected in series among said temperature sensors in said pixels that are adjacent respectively in the row-direction and the column-direction, and
- said switching means switches said state by turning ON/OFF said switching transistors by means of two control signals.

* * * * *